(12) United States Patent
Tateishi et al.

(10) Patent No.: US 12,347,629 B2
(45) Date of Patent: Jul. 1, 2025

(54) STRUCTURE EXHIBITING A FLEXOELECTRIC EFFECT

(71) Applicant: Murata Manufacturing Co., Ltd., Nagaokakyo (JP)

(72) Inventors: Takashi Tateishi, Nagaokakyo (JP); Kou Tanaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/364,758

(22) Filed: Aug. 3, 2023

(65) Prior Publication Data

US 2023/0386755 A1    Nov. 30, 2023

Related U.S. Application Data

(63) Continuation of application No. PCT/JP2022/025546, filed on Jun. 27, 2022.

(30) Foreign Application Priority Data

Jun. 29, 2021    (JP) .................... 2021-107860

(51) Int. Cl.
*H01G 7/02*    (2006.01)
(52) U.S. Cl.
CPC .................... *H01G 7/026* (2013.01)
(58) Field of Classification Search
None
See application file for complete search history.

(56) References Cited

U.S. PATENT DOCUMENTS

| | | | |
|---|---|---|---|
| 4,250,415 | A | 2/1981 | Lewiner |
| 2015/0295163 | A1 | 10/2015 | Komeda et al. |
| 2016/0285391 | A1 | 9/2016 | Asanuma et al. |
| 2021/0351337 | A1 | 11/2021 | Ogasahara et al. |

FOREIGN PATENT DOCUMENTS

| | | | |
|---|---|---|---|
| CN | 109950045 | A | 6/2019 |
| JP | 2008053527 | A | 3/2008 |
| JP | 2008064866 | A | 3/2008 |
| JP | 2013225608 | A * | 10/2013 |
| JP | 2014121201 | A | 6/2014 |
| JP | 5859370 | B2 | 2/2016 |
| WO | 2014017184 | A1 | 1/2014 |
| WO | 2020049912 | A1 | 3/2020 |

OTHER PUBLICATIONS

Henmi, N., "Flexoelectric effect of solid material and its applicability," Proceedings of Academic Lecture of Autumn Meeting of the Japan Society for Precision Engineering, 2019, Shinsu University, pp. 336-337.
International Search Report in PCT/JP2022/025546, mailed Sep. 6, 2022, 3 pages.
Wen et al., "Flexoelectret: An Electret with a Tunable Flexoelectriclike Response," Physical Review Letters, Apr. 2019, vol. 122, No. 148001, 6 pages.

* cited by examiner

*Primary Examiner* — Daniel Cavallari
(74) *Attorney, Agent, or Firm* — ArentFox Schiff LLP

(57) ABSTRACT

A flexoelectric structure that includes a flexible ceramic electret portion containing a ceramic component, the flexible ceramic electret portion including a charge retaining ceramic portion and an internal electrode positioned at an internal location of the charge retaining ceramic portion; and a flexible member outside the flexible ceramic electret portion.

20 Claims, 7 Drawing Sheets

STRUCTURE EXHIBITING A FLEXOELECTRIC EFFECT

CROSS REFERENCE TO RELATED APPLICATIONS

The present application is a continuation of International application No. PCT/JP2022/025546, filed Jun. 27, 2022, which claims priority to Japanese Patent Application No. 2021-107860, filed Jun. 29, 2021, the entire contents of each of which are incorporated herein by reference.

TECHNICAL FIELD

The present disclosure relates to a structure exhibiting a flexoelectric effect.

BACKGROUND ART

While a piezoelectric effect is an electric polarization phenomenon that occurs in proportion to stress applied to a material, a flexoelectric effect is an electric polarization phenomenon that occurs in proportion to the rate of spatial change in strain of a material, that is, "strain gradient" (see, for example, Non-Patent Document 1).

For example, since a liquid crystal can easily have a large shape change, it is known that electric polarization due to such a phenomenon significantly appears.

On the other hand, in common solid materials, it is known that there are few deformation forms in which a large strain gradient appears, and polarization due to the piezoelectric effect is generally larger.

Patent Document 1: Chinese (CN) Patent Application Laid-Open No. 109950045

Non-Patent Document 1: "Flexoelectric effect of solid material and its applicability", Proceedings of Academic Lecture of Autumn Meeting of the Japan Society for Precision Engineering, 2019, 336 to 337, Shinshu University, Nobuhiko Henmi Non-Patent Document 2: Flexoelectret: An Electret with a Tunable Flexoelectriclike Response, Xin Wen, Dongfan Li, Kai Tan, Qian Deng, and ShengpingShen, PHYSICAL REVIEW LETTERS 122, 148001 (2019).

SUMMARY OF THE INVENTION

At present, examples in which a flexoelectric effect is practically used in a solid material are rarely found, and only examples using polymer thin films are known (for example, Patent Document 1).

The present inventors have found that there is still room for development of a solid material capable of exhibiting a flexoelectric effect.

The present invention has been made in view of the above problems. That is, a main object of the present invention is to provide a new structure capable of exhibiting a flexoelectric effect.

The inventors of the present application have attempted to solve the above problem not by taking a measure derived from a conventional technique but by a new way. As a result, this has led to the invention of a structure that has achieved the main object.

A structure according to the present disclosure includes: a flexible ceramic electret portion containing a ceramic component, the flexible ceramic electret portion including a charge retaining ceramic portion and an internal electrode positioned at an internal location of the charge retaining ceramic portion; and a flexible member outside the flexible ceramic electret portion.

The structure according to the present disclosure is a new structure capable of exhibiting a flexoelectric effect. Specifically, the structure of the present disclosure is a structure having a ceramic electret and exhibiting a flexoelectric effect, and is a new flexoelectret structure at least in that respect.

DETAILED DESCRIPTION OF THE INVENTION

Figure 1:
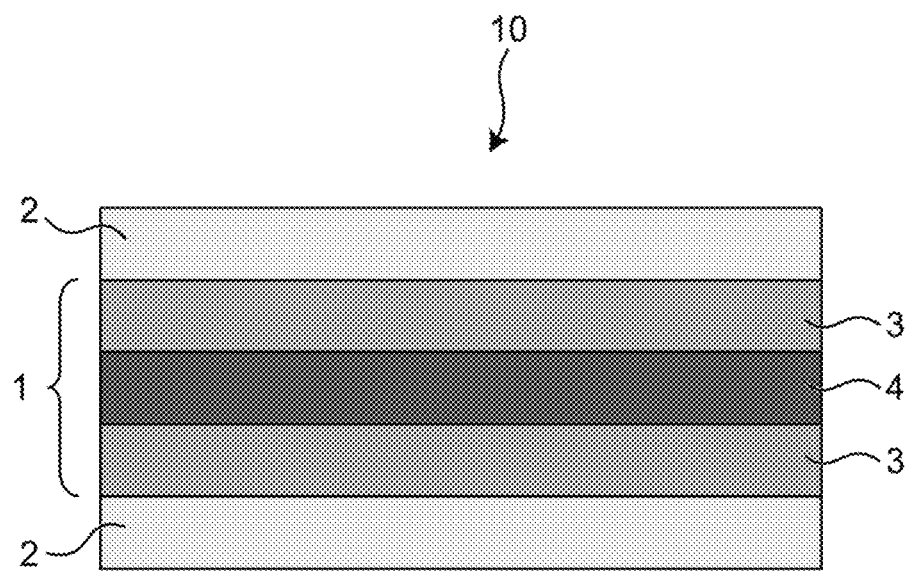
FIG. 1 is a schematic sectional view schematically illustrating a structure according to a first embodiment of the present disclosure.

Hereinafter, a structure according to an embodiment of the present invention will be described in more detail. Although the description will be made with reference to the drawings as necessary, various elements in the drawings are merely shown schematically and exemplarily for the understanding of the present invention, and appearance and/or dimensional ratios and the like may be different from actual ones.

The term "sectional view" directly or indirectly described in the present specification is based on a virtual section obtained by cutting the structure, for example, along the laminating direction of the layers constituting the structure. Similarly, a direction of a "thickness" described directly or indirectly in the present specification is based on, for example, a laminating direction of the layers constituting the structure.

The terms "up-down direction" and "left-right direction" directly or indirectly used in the present specification respectively correspond to the up-down direction and the left-right direction in the drawing. Unless otherwise specified, the same signs or symbols shall denote the same members or portions or the same meanings. In a suitable mode, when the laminating direction of a structure can correspond to the up-down direction, it can be understood that a vertical downward direction (that is, a direction in which gravity acts) corresponds to the term "downward direction"/"bottom surface side", and the opposite direction corresponds to the term "upward direction"/"top surface side".

The various numerical ranges mentioned in the present specification are intended to include the lower and upper limit numerical values themselves unless otherwise specified. Note that the terms "about", "approximately", and "degree" mean that they may include variations or differences of a few percent, e.g., ±10%.

<<Knowledge and the Like Underlying the Present Disclosure>>

A solid material, a solid material body, or a solid article (hereinafter also collectively referred to as a "solid material article") capable of exhibiting a flexoelectric effect is called a flexoelectret or a flexoelectret structure.

Figure 9A:
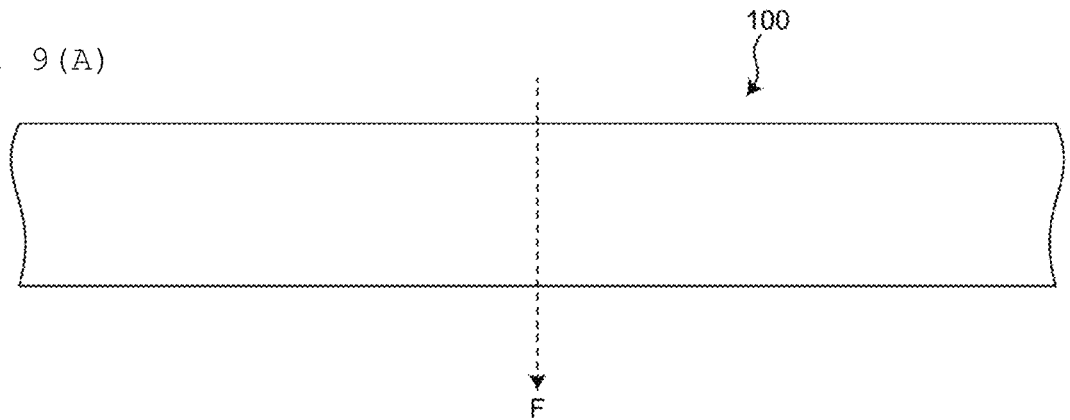
FIGS. 9(A) and 9(B) are schematic diagrams schematically illustrating a flexoelectret structure.
Figure 9B:
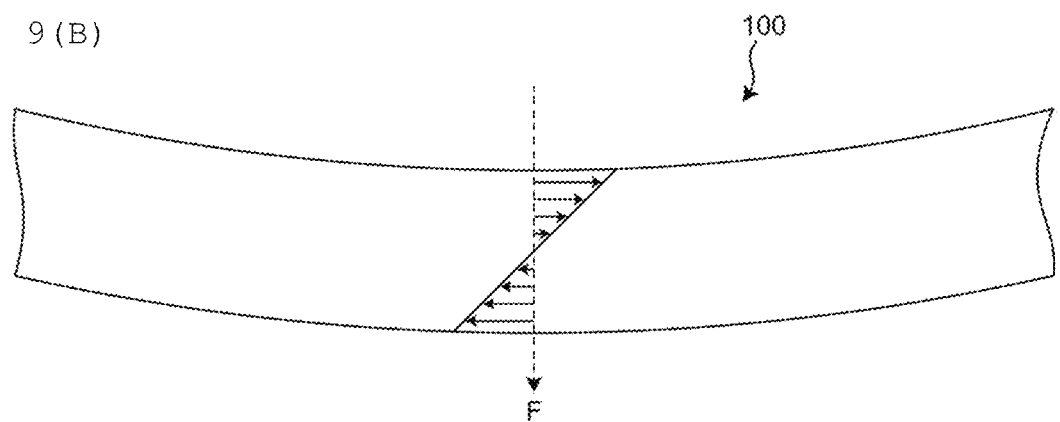

FIGS. 9(A) and 9(B) schematically illustrate how a "strain gradient" is generated in a conventional flexoelectret structure.

When force (F) is applied to a flexoelectret 100 having a shape such as a rod or a beam as illustrated in FIG. 9(A) and a bending moment is applied, the strain changes along a thickness direction of the flexoelectret 100 at a certain gradient (preferably, a constant gradient), for example, from compression to tension, as illustrated in FIG. 9(B). The rate of such a spatial change in strain is referred to as a "strain gradient".

Figure 10A:
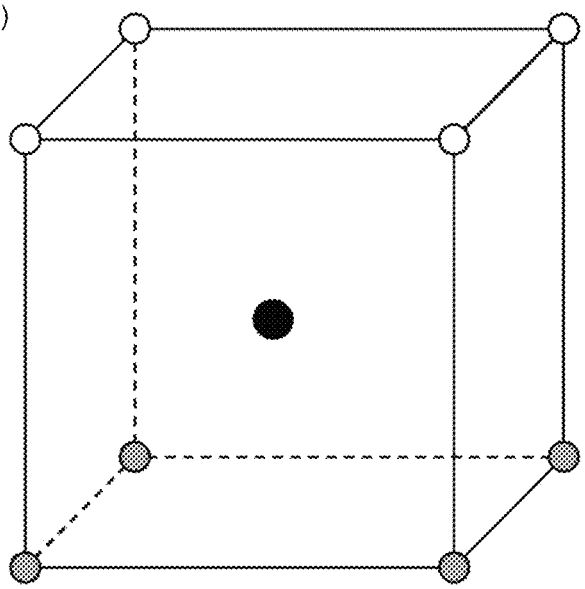
FIGS. 10(A) and 10(B) are schematic diagrams schematically explaining the principle of the flexoelectric effect.
Figure 10B:
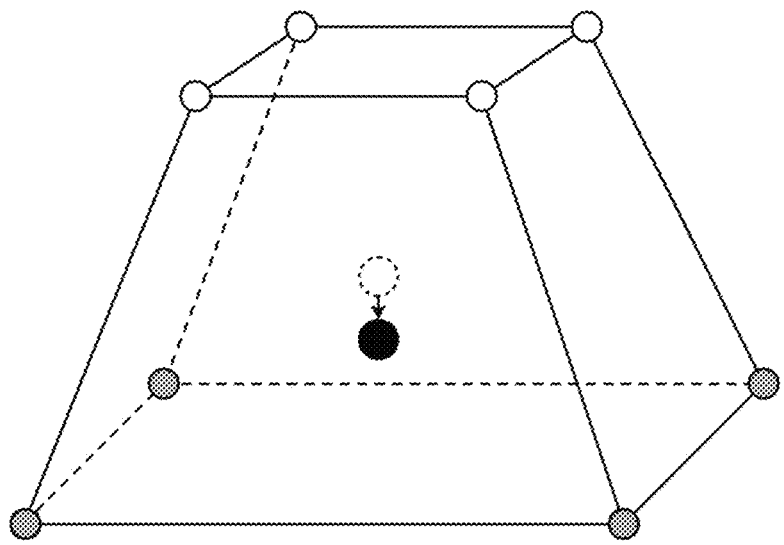

A case where a strain gradient occurs in a crystal structure such as a perovskite structure will be described with reference to the schematic diagrams of FIGS. 10(A) and 10(B). For example, when compression is applied from the left-right direction (or horizontal direction) to the ions (white) on the upper part of the crystal structure illustrated in FIG. 10(A) and tension is applied from the left-right direction (or horizontal direction) to the ions (gray) on the lower part, the central ion (black circle) moves downward (FIG. 10(B)). As a result, in a case where such an ion is, for example, a positive ion, the lower part of the crystal structure is electrically polarized so as to be positively charged.

As described above, while the flexoelectric effect is a phenomenon that does not depend on polarization treatment of the solid material article, it is considered that the magnitude of polarization due to the flexoelectric effect is further increased by the polarization treatment.

Here, when the solid material article is stressed, the electric polarization that can occur in the solid material article can be expressed by the following Formula (I).

$$P_i = d_{ijk}\sigma_{jk} + \mu_{ijkl}\frac{\partial \varepsilon_{jk}}{\partial x_l} \quad (I)$$

In the formula (I),
P represents the electric polarization,
d represents the piezoelectric constant,
σ represents the stress,
ε represents the strain,
x represents the position,
μ represents the flexoelectric coefficient, and
i, j, k, and l are subscripts on the tensor, and represent directions in a 3-dimensional space. In the case of a flexoelectret 100 having a shape such as a rod or a beam as illustrated in FIG. 9(A), the longitudinal direction is denoted by a subscript 1, the width direction is denoted by a subscript 2, and the thickness direction is denoted by a subscript 3.

Herein, μ (flexoelectric coefficient) is an order 4 tensor quantity, and represents the constant of proportionality between the strain gradient and the amount of polarization.

For example, in deformation due to bending (bending mode) as illustrated in FIG. 9(A), since the strain may change symmetrically in the up-down direction relative to the neutral plane, the amount of polarization due to the piezoelectric effect can be canceled as a whole. Thus, Formula (I) can be expressed by Formula (II).

$$P_i = \mu_{ijkl}\frac{\partial \varepsilon_{jk}}{\partial x_l} \quad (II)$$

In the formula (II), each sign is as defined above.

Formula (II) can be expressed by Formula (III) when $P_1$ is $P_3$ which represents the average of the electric polarizations in a subscript 3 direction as the thickness direction.

$$\overline{P}_3 = \mu_{13}\overline{\frac{\partial \varepsilon_{11}}{\partial x_3}} \quad (III)$$

In the formula (III),
$\overline{P}_3$ represents the average of the electric polarizations in the thickness direction,
$\mu_{13}$ represents the lateral flexoelectric coefficient which is the constant of proportionality between the strain gradient in the thickness direction formed corresponding to the strain in the longitudinal direction and the polarization generated in the thickness direction, and $$\overline{\frac{\partial \varepsilon_{11}}{\partial x_3}}$$

represents the average of the strain gradients relative to the thickness direction.

As described above, the flexoelectric effect in the solid material article, particularly, the flexoelectric effect due to bending can be evaluated by the flexoelectric coefficient.

For a typical polymer, the flexoelectric coefficient is $1.0 \times 10^{-8}$ C/m. For example, in the case of polyvinylidene fluoride (PVDF) known as a piezoelectric polymer, the flexoelectric coefficient is known to be $1.3 \times 10^{-8}$ C/m.

Figure 11:
FIG. 11 is a schematic sectional view schematically illustrating a conventional polymer flexoelectret structure.

For example, as illustrated in FIG. 11, in a polymer flexoelectret 200 formed by sandwiching a thin film 201 of a charged polymer (for example, polytetrafluoroethylene (PTFE)) that retains a charge, between two outer polymer (PTFE) thin films 202, the flexoelectric coefficient is increased to about 5 times that of a normal polymer, specifically, to $5.3 \times 10^{-8}$ C/m by previously polarizing the two outer polymer thin films 202 with the charged polymer thin film 201 (for example, Patent Document 1).

However, in the case of the conventional flexoelectret, the problem is that the flexoelectric effect is smaller than the piezoelectric effect. In particular, the problem is that the flexoelectric coefficient is smaller than the piezoelectric constant. Moreover, in the case of a conventional polymer electret, since the polymer electret is produced using a polymer as a raw material, the polymer electret has problems that, for example, durability such as weather resistance is poor, and when brought into contact with or immersed in a liquid such as water and/or an organic solvent, the polymer electret lost electric charge, whereby the electric effect is reduced. The present disclosure has attempted to solve such problems. More specifically, development has been made in order to provide a structure having more suitable flexoelectric performance in at least one of the following respects: flexoelectric coefficient, flexoelectric effect, durability such as weather resistance, and the feature that electric charge is less likely to be lost also in a case where the structure is brought into contact with or immersed in a liquid such as water and/or an organic solvent, as a result of which the flexoelectric effect can be maintained for a longer time.

The structure of the present disclosure has been obtained through the above-described development process. This will be described below.

For example, the flexoelectric coefficient in the bending mode is proportional to the thickness of the entire flexoelectret structure and the charge density of the electret portion as expressed by the following Formula (IV) (for example, Non-Patent Document 2).

$$\mu_{13}^{eff} \approx -\frac{Hq}{4} \quad \text{(IV)}$$

In the formula (IV), $\mu$ represents the flexoelectric coefficient,

H represents the thickness of the entire flexoelectret structure, and q represents the charge density of the electret portion.

In the case of a flexoelectret 100 having a shape such as a rod or a beam as illustrated in FIG. 9(A), the super/subscript on p denotes that polarization in a subscript 3 direction as the thickness direction is generated due to the strain gradient in the thickness direction formed corresponding to the strain in a subscript 1 direction as the longitudinal direction.

From such knowledge, it has been found that the flexoelectric coefficient increases as the charge density of the electret portion increases. Thus, the present inventors have studied to use a ceramic electret having a higher charge density than a polymer electret such as a charged polymer. Moreover, in order to develop a ceramic electret article that is more desirable for the bending mode, they have studied to increase the flexoelectric coefficient also in the bending mode.

As a result of various intensive studies under such circumstances, the following structure of the present disclosure has been finally produced. The structure includes a flexible member outside the electret portion, the electret portion is a ceramic electret containing a ceramic component, and includes a charge retaining ceramic portion and an internal electrode positioned at an internal location of the charge retaining ceramic portion, and the electret portion has flexibility. Such a structure of the present disclosure can be a structure having further improved flexoelectric performance in at least one of the following respects: flexoelectric coefficient, flexoelectric effect, durability such as weather resistance, and the feature that electric charge is less likely to be lost also in a case where the structure is brought into contact with or immersed in a liquid such as water and/or an organic solvent, as a result of which the flexoelectric effect can be maintained for a longer time (note that such effects described in the present specification are merely examples and are not limited thereto, and there may be additional effects).

<<Structure of Present Disclosure>>

The present disclosure relates to a structure with improved flexoelectric performance (hereinafter, sometimes referred to as a "flexoelectret article" or a "flexoelectret structure").

In the present disclosure, the term "flexoelectric performance", particularly "improved flexoelectric performance" mainly means that a larger flexoelectric coefficient and a larger flexoelectric effect are exhibited.

As the flexoelectric performance, the structure may further have durability such as weather resistance, and performance that, for example, electric charge is less likely to be lost also in a case where the structure is brought into contact with or immersed in a liquid such as water and/or an organic solvent, as a result of which the flexoelectric effect can be maintained for a longer time.

The structure of the present disclosure is a structure capable of exhibiting a flexoelectric effect. Thus, the structure of the present disclosure can also be referred to as a "flexoelectret body", a "flexoelectret article", a "flexoelectret structure", or the like.

In the present disclosure, the "flexoelectric effect" means an electric polarization phenomenon that can occur in proportion to the rate of spatial change in strain of a structure, that is, "strain gradient" (see FIG. 9(A)). The flexoelectric effect is a phenomenon that can occur in a dielectric, but is an electric polarization phenomenon totally different from the piezoelectric effect that can occur in proportion to stress.

For example, when a solid material article is stressed, the electric polarization that can occur in such a solid material article can be expressed by the following Formula (I), as described above.

$$P_i = d_{ijk}\sigma_{jk} + \mu_{ijkl}\frac{\partial \varepsilon_{jk}}{\partial x_i} \quad \text{(I)}$$

In the formula (I),

P represents the electric polarization, d represents the piezoelectric constant, $\sigma$ represents the stress, $\varepsilon$ represents the strain, x represents the position, $\mu$ represents the flexoelectric coefficient, and i, j, k, and l are subscripts on the tensor, and represent directions in a 3-dimensional space. In the case of a flexoelectret 100 having a shape such as a rod or a beam as illustrated in FIG. 9(A), the longitudinal direction is denoted by a subscript 1, the width direction is denoted by a subscript 2, and the thickness direction is denoted by a subscript 3.

In the present disclosure, the "flexoelectric coefficient" ($\mu$) is an order 4 tensor quantity, and means the constant of proportionality between the strain gradient and the amount of polarization.

In the bending mode as illustrated in FIG. 9(A), since the strain changes symmetrically in the up-down direction relative to the neutral plane, the amount of polarization due to the piezoelectric effect can be canceled as a whole ($\sigma$ (stress)=0). Thus, Formula (I) can be expressed by Formula (II).

$$P_i = \mu_{ijkl}\frac{\partial \varepsilon_{jk}}{\partial x_i} \quad \text{(II)}$$

In the formula (II), each sign is as defined above.

Formula (II) can be expressed by Formula (III) when $P_1$ is $\overline{P}_3$ which represents the average of the electric polarizations in a subscript 3 direction as the thickness direction.

$$\overline{P}_3 = \mu_{13} \overline{\frac{\partial \varepsilon_{11}}{\partial x_3}} \qquad (III)$$

In the formula (III), $\overline{P}_3$ represents the average of the electric polarizations in the thickness direction, $\mu_{13}$ represents the lateral flexoelectric coefficient which is the constant of proportionality between the strain gradient in the thickness direction formed corresponding to the strain in the longitudinal direction and the polarization generated in the thickness direction, and $$\overline{\frac{\partial \varepsilon_{11}}{\partial x_3}}$$

represents the average of the strain gradients relative to the thickness direction.

As described above, in the bending mode, since the amount of polarization due to the piezoelectric effect can be canceled as a whole, the value of the electric polarization (P) increases as the value of the "flexoelectric coefficient" (μ) increases. In other words, the larger the flexoelectric coefficient, the larger the flexoelectric effect.

In the present disclosure, the "bending mode" means a system in which strain may occur in a structure when bending is applied to the structure, in other words, a system in which a bending moment may act on the structure.

However, the flexoelectric effect in the present disclosure is not necessarily limited to the flexoelectric effect in the bending mode.

The "flexoelectric coefficient" of the flexoelectret structure of the present disclosure is, for example, larger than approximately $1.0 \times 10^{-8}$ C/m, preferably larger than $1.3 \times 10^{-8}$ C/m, more preferably larger than $5.0 \times 10^{-8}$ C/m, and still more preferably larger than $5.3 \times 10^{-8}$ C/m. When the flexoelectric coefficient is within such a range, a larger flexoelectric effect can be exhibited. The upper limit of the flexoelectric coefficient is not particularly limited, and may be, for example, about $50 \times 10^{-8}$ C/m, about $40 \times 10^{-8}$ C/m, about $30 \times 10^{-8}$ C/m, about $20 \times 10^{-8}$ C/m, or about $10 \times 10^{-8}$ C/m.

In the present disclosure, the shape of the flexoelectret structure is not particularly limited. The flexoelectret structure may have any shape such as a plate shape or a sheet shape (including a strip shape), a rod shape, or a fiber shape (including a fiber), and thus the sectional shape is not particularly limited. The sectional shape of the flexoelectret structure may have any geometric shape, e.g., rectangular and/or circular.

In the present disclosure, the flexoelectret structure may have a shape and structure that can be bent by external force. In other words, the flexoelectret structure may have flexibility. The flexoelectret structure preferably has flexibility as a whole.

In the present disclosure, the "flexibility" of the flexoelectret structure means, in a broad sense, that the structure (and constituent elements of the structure such as the ceramic electret and the flexible member) is warped or deformed by receiving external force, and preferably means that the structure is warped without cracking and/or chipping. In a narrow sense, the "flexibility" means that a structure bends with any radius of curvature when bent, for example, as illustrated in FIG. 9(A), that is, the ceramic electret and the flexible member which are constituent elements of the structure bend with any radius of curvature (preferably, bend without cracking and/or chipping).

When the flexoelectret structure receives external force and bends, for example, as illustrated in FIG. 9(A) (preferably, when the structure bends without cracking and/or chipping), the structure (preferably the electret portion thereof) may have a radius of curvature of about 5000 mm or less, for example, 4000 mm or less, 3000 mm or less, 2000 mm or less, 1500 mm or less, 1300 mm or less, 1200 mm or less, or 1100 mm or less, and preferably has a radius of curvature of 1000 mm or less. That is, in a preferred mode, when the structure of the present disclosure receives external force and the electret portion is displaced, the electret portion has a radius of curvature of 1000 mm or less in sectional view. When the radius of curvature is within such a range, it is easy to achieve higher flexibility, and thus, a larger flexoelectric effect can be obtained. The lower limit of the radius of curvature is not particularly limited, but may be, for example, about 500 mm, 600 mm, 700 mm, 800 mm, 900 mm, or 950 mm. Note that the radius of curvature may be based on the contour (particularly, the main surface contour) of the structure or the electret portion thereof in a sectional view or a side view (for example, typically, a sectional view as illustrated in FIG. 9(A)) of the structure obtained as an image such as an optical micrograph or an electron micrograph, and may be based on a contour portion having the largest bending in the contour.

In the present disclosure, the "thickness" of the flexoelectret structure is not particularly limited. Preferably, the structure has a thickness that contributes to the bending of the structure and contributes to the flexibility, particularly the radius of curvature.

The entire thickness of the flexoelectret structure may be about 50 mm or less, 40 mm or less, 30 mm or less, or 20 mm or less, and is, for example, 10 mm or less. Furthermore, the entire thickness of the flexoelectret structure may be 5 mm or less, for example, 3 mm or less, 2.2 mm or less, or 2 mm or less (the lower limit of such a value may be, for example, about 0.5 mm or 1 mm). When the thickness of the structure is within such a range, a larger flexoelectric effect is easily obtained.

First Embodiment

FIG. 1 illustrates a flexoelectret structure of the present disclosure as a first embodiment. The structure illustrated in FIG. 1 is for describing the concept of the flexoelectret structure of the present disclosure, and the illustrated content is merely schematic and exemplary for understanding the present invention.

The structure (10) (hereinafter, sometimes referred to as the "structure of the present disclosure") illustrated in FIG. 1 is a structure including an electret portion (1). The structure (10) includes a flexible member (2) outside the electret portion (1). Preferably, the structure (10) includes flexible members (2) outside corresponding to both sides of the electret portion (1). It can also be said that the structure (10) includes the electret portion (1) at an internal location of the flexible member (2). Such an electret portion (1) is a ceramic electret containing a ceramic component, and includes a charge retaining ceramic portion (3) and an internal electrode (4) positioned at an internal location of or inside the charge retaining ceramic portion (3), and the electret portion (1) has flexibility. That is, the electret portion (1) provided as a ceramic electret containing a ceramic component includes the internal electrode (4) and the charge retaining ceramic portion (3) outside the internal electrode (4), and has flexibility as a whole.

In the structure (10) of the present disclosure, the flexible member (2) is provided outside (preferably on both sides) the electret portion (1) having flexibility. That is, two types of members exhibiting flexibility are provided so as to overlap with each other or to be laminated. Since the electret portion (1) provided as the ceramic electret has flexibility, and the flexible member (2) provided on the main surface thereof also has flexibility, the structure of the present disclosure can exhibit flexibility. Thus, the structure (10) of the present disclosure can be bent suitably as the entire structure, and preferably, can be bent such that a bending moment is suitably generated. When the structure is bent, for example, as illustrated in FIG. 9(A), a bending moment is suitably generated, and a flexoelectric effect is obtained.

The structure (10) is characterized in that the electret portion (1) is a ceramic electret containing a ceramic component, and the electret portion (1) includes a charge retaining ceramic portion (3) and an internal electrode (4) positioned at an internal location of the charge retaining ceramic portion (3).

As will be described in detail below, ceramic electrets can exhibit technical effects different from that of polymer electrets. Specifically, the ceramic electrets can have a higher charge density in the charge retaining ceramic portion (3) and a more improved flexoelectric coefficient than conventional polymer electrets. Thus, in the structure of the present disclosure, a larger flexoelectric effect can be brought about (see Formula (IV) below). Compared to conventional polymer electrets, large voltage generation or electricity generation is possible with the same amount of displacement.

Moreover, by increasing the entire thickness of the flexoelectret structure, particularly the thickness of the flexible member, within a range in which the structure (10) has flexibility, a larger flexoelectric effect can be obtained, and a larger voltage can be generated (see Formula (IV) below). That is, the flexoelectric effect can be made more apparent due to the thickness of the flexible member. As will be described later, the flexible member (2) may have a thickness larger than each thickness of the internal electrode (4) and the charge retaining ceramic portion (3).

These effects can be understood from the fact that, for example, the flexoelectric coefficient in the bending mode can be proportional to the "thickness" of the entire flexoelectret structure and the "charge density" of the electret portion as expressed by Formula (IV).

$$\mu_{13}^{eff} \approx -\frac{Hq}{4} \quad \text{(IV)}$$

In the formula (IV),
μ represents the flexoelectric coefficient,
H represents the thickness of the entire flexoelectret structure, and
q represents the charge density of the electret portion, In the case of a flexoelectret 100 having a shape such as a rod or a beam as illustrated in FIG. 9(A), the super/sub-script on p denotes that polarization in a subscript 3 direction as the thickness direction is generated due to the strain gradient in the thickness direction formed corresponding to the strain in a subscript 1 direction as the longitudinal direction.

Furthermore, in the structure of the present disclosure, by using the ceramic electret, the durability such as weather resistance can be improved as compared with conventional polymer electrets, and preferably such durability is more significantly improved. By using the ceramic electret, also in a case where the ceramic electret is brought into contact with or immersed in a liquid such as water and/or an organic solvent, the electric charge is less likely to be lost, as a result of which the flexoelectric effect is easily maintained for a longer time. Thus, the structure of the present disclosure can be suitably used also in a more severe environment, in particular, outdoors, a higher temperature environment, or the like.

The electret portion (1) included in the structure (10) can be regarded as a dielectric as described in detail below. Although not being bound by a specific theory, electric polarization is generated in the electret portion (1), whereby electric polarization tends to be suitably induced also in the flexible member (2) positioned outside the electret portion (1), as a result of which a larger flexoelectric effect is easily exhibited, and a larger voltage can be generated.

The radius of curvature of the structure (10) in the bending mode is, for example, 1500 mm or less, 1300 mm or less, 1200 mm or less, or 1100 mm or less, and preferably 1000 mm or less. That is, although the structure of the present disclosure is a laminated article including a ceramic element, it can exhibit suitable flexibility, and a more suitable flexoelectric effect can be brought about. The total thickness of the structure (10) may be 0.1 mm to 10 mm, mm to 5 mm, or the like.

In the structure (10), the ratio regarding the thicknesses of the charge retaining ceramic portion (3) and the internal electrode (4) that can be included in the electret portion (1) and the thickness of the flexible member (2) is not particularly limited. In a preferred mode, the structure has a thickness relationship: flexible member (2)>internal electrode (4)>charge retaining ceramic portion (3). That is, the thickness of the flexible member (2) may be larger than the thickness of the internal electrode (4), and the thickness of the internal electrode (4) may be larger than the thickness of the charge retaining ceramic portion (3) (i.e., the thickness of the flexible member (2) may be larger than the thickness of the charge retaining ceramic portion (3)). By adjusting the thickness of each layer in this order, it becomes easy to exhibit higher flexibility, and it becomes easy to bring about a larger flexoelectric effect. Here, the thickness of the charge retaining ceramic portion (3) is a thickness for the charge retaining ceramic portion positioned on either the upper side or the lower side of the internal electrode (4) in the sectional view of the structure. Similarly, the thickness of the flexible member (2) also means the thickness of the flexible member positioned on either the upper side or the lower side of the internal electrode (4) in the sectional view of the structure.

The flexoelectric coefficient of the structure (10) is, for example, larger than $1.3 \times 10^{-8}$ C/m, preferably larger than $5.0 \times 10^{-8}$ C/m, and more preferably larger than $5.3 \times 10^{-8}$ C/m (for example, larger than $5.5 \times 10^{-8}$ C/m). When the flexoelectric coefficient is within such a range, a larger flexoelectric effect can be provided in the structure of the present disclosure. The upper limit of the flexoelectric coefficient of the structure (10) is not particularly limited, and may be $30 \times 10^{-8}$ C/m, $20 \times 10^{-8}$ C/m, $10 \times 10^{-8}$ C/m, $9 \times 10^{-8}$ C/m, $8 \times 10^{-8}$ C/m, or the like (the upper limit may include the value itself).

The structure (10) can be provided as an unprecedented flexoelectret structure in terms of a ceramic electret that can have a larger flexoelectric coefficient and can at least exhibit a suitable flexoelectric effect (preferably more significant flexoelectric effect).

Hereinafter, the "electret portion (1)" and the "flexible member (2)" included in the structure (10) will be described in detail.

(Electret Portion)

In the present disclosure, the "electret portion" (1) is typically a portion capable of retaining either positive or negative charge on its surface. Because of this, the electret portion can also be referred to as a "charge retaining portion". The electret portion (1) can polarize the surface of the flexible member (2) by retaining either positive or negative charge on its surface.

In the structure of the present disclosure, the electret portion (1) is a ceramic electret containing a ceramic component. The ceramic electret (1) includes a charge retaining ceramic portion (3) and an electrode positioned at an internal location of or inside the charge retaining ceramic portion (3), that is, an internal electrode (4) (see FIG. 1). The charge retaining ceramic portion (3) contains at least a ceramic component.

When the structure (10) receives external force and the electret portion (1) is displaced, particularly when a bending moment is applied (see FIG. 9(A)), the electret portion (1) may have a radius of curvature of 5000 mm or less in a sectional view thereof, for example, may have a radius of curvature of 4000 mm or less, 3000 mm or less, 2000 mm or less, 1500 mm or less, 1300 mm or less, 1200 mm or less, or 1100 mm or less, and preferably has a radius of curvature of 1000 mm or less. The radius of curvature within such a range of the electret portion (1) means that higher or more suitable flexibility may be provided to the structure, and thus a larger flexoelectric effect may be provided to the structure. The lower limit of the radius of curvature is not particularly limited, but may be, for example, about 500 mm, 600 mm, 700 mm, 800 mm, 900 mm, or 950 mm.

In the structure of the present disclosure, the ceramic electret positioned inside the flexible member may be a member thinner than the flexible member. That is, in the sectional view of the structure, the thickness of the ceramic electret positioned inside the flexible member may be smaller than the thickness of the flexible member. As a result, while the electret contains a ceramic component, the structure as a whole easily exhibits suitable flexibility. That is, since the thickness of the ceramic electret positioned relatively inside is smaller than the thickness of the flexible member positioned relatively outside, the structure easily bends with any radius of curvature (preferably capable of bending without cracking and/or chipping) when bent, as a result of which a suitable flexoelectric effect (preferably, a more significant flexoelectric effect) is easily provided to the structure.

(Ceramic Electret)

In the present disclosure, the "ceramic electret" means an electret containing a "ceramic component" to be described in detail below. The specific ceramic component contained in the ceramic electret is not particularly limited as long as the charge can be retained. In the present disclosure, the whole ceramic electret is not necessarily composed of a ceramic component. For example, the ceramic electret may be composed of a ceramic component and other components (for example, resin), or a partial region of the ceramic electret may be a non-ceramic region.

(Charge Retaining Ceramic Portion)

In the present disclosure, the "charge retaining ceramic portion" (3) can retain the charge on its surface due to dielectric polarization. In other words, the charge retaining ceramic portion (3) may be a substance in which dielectric polarization can occur upon applying an electric field, that is, a dielectric. Here, the dielectric polarization refers to a phenomenon in which charges in a dielectric are divided into positive and negative electrodes by the action of an external electric field. In the present disclosure, the dielectric polarization can be used as a term having the same meaning as the electric polarization.

The charge retaining ceramic portion is a member containing a ceramic component, and may include an electrode. For example, the charge retaining ceramic portion (3) has an internal electrode (4) at an internal location of or inside the charge retaining ceramic portion (3), and the internal electrode (4) can serve as an electrode for grounding or ground (GND) connection. In the charge retaining ceramic portion (3), for example, when the surface in contact with the internal electrode (4) retains a positive charge and the opposite surface retains a negative charge, the positive charge is electrostatically shielded by the ground, and only the negative charge can be retained on the outer side of the charge retaining ceramic portion (3). In the opposite case, only the positive charge can be retained on the outer side of the charge retaining ceramic portion (3). In this way, when polarization is due to dielectric polarization or electric polarization, it is possible to charge to either positive or negative polarity.

The position of the internal electrode (4) to be disposed at an internal location of or inside the charge retaining ceramic portion (3) is not particularly limited. In the embodiment illustrated in FIG. 1, the internal electrode (4) is interposed between the charge retaining ceramic portions (3) such that the charge retaining ceramic portions (3) and the internal electrode (4) are in contact with each other. It can also be said that the internal electrode (4) is interposed so as to be sandwiched between two members of the charge retaining ceramic portion (3). In a preferred mode, the internal electrode (4) is positioned at the geometrical center of the charge retaining ceramic portion (3). For example, as illustrated in FIG. 1, the internal electrode (4) may be positioned such that the internal electrode (4) exists at an intermediate position in the thickness direction (overall thickness) of the charge retaining ceramic portion (3).

The shape of the charge retaining ceramic portion (3) is not particularly limited. When more emphasis is placed on the charge density, the charge retaining ceramic portion (3) may have a plate shape or a sheet shape. That is, the charge retaining ceramic portion (3) may extend on the same plane. For example, the charge retaining ceramic portion (3) may have a layer shape (preferably in the form of a layer extending on the same plane or in the form of a layer extending on a curved surface). Similarly, when more emphasis is placed on the charge density, the charge retaining ceramic portion (3) may have an elongated shape, for example, a strip shape (preferably a long and narrow strip shape). Alternatively, when more emphasis is placed on the flexibility and/or the bendability, the charge retaining ceramic portion (3) may have a fiber shape (particularly a long and narrow shape). The sectional shape (for example, an outer contour in a sectional view) of the charge retaining ceramic portion (3) may be square, rectangular, or circular, and may be any other geometric shape. For example, when more emphasis is placed on the flexibility and/or the bendability, the charge retaining ceramic portion (3) may have a circular profile or an elliptical profile (for example, a circular or elliptical outline) in its sectional view. In a preferred mode, the charge retaining ceramic portion (3) has, for example, a tubular shape (see FIG. 8).

The charge retaining ceramic portion (3) preferably has flexibility and/or bendability. For example, the thickness (thickness dimension in a sectional view) of the charge retaining ceramic portion (3) may be 1 mm or less, and may be, for example, 0.005 mm to 1 mm, 0.005 mm to 0.5 mm, 0.005 mm to 0.3 mm, or 0.01 mm to 0.1 mm. The charge retaining ceramic portion (3) having such a thickness tends to exhibit suitable flexibility and/or bendability.

(Internal Electrode)

In the present disclosure, the "internal electrode" (4) has conductivity. In other words, the internal electrode includes at least a material having conductivity. For example, the internal electrode includes a "metal" and/or a "conductive material" to be described below, and may include other components as necessary.

Since the internal electrode (4) has conductivity, the internal electrode (4) can serve as an electrode of the electret portion for grounding or ground (GND) connection. Thus, when the charge retaining ceramic portion (3) is polarized by dielectric polarization or electric polarization, the charge retaining ceramic portion (3), in particular its surface, can be charged either positively or negatively. In the embodiment illustrated in FIG. 1, charges can be retained in a manner in which both of the members of the two charge retaining ceramic portions (3) provided outside the internal electrodes (4) in pairs (that is, the member of the charge retaining ceramic portion (3) positioned on the upper side of the internal electrode (4) and the member of the charge retaining ceramic portion (3) positioned on the lower side of the internal electrode (4)) are positively charged, or both of the two members of the charge retaining ceramic portions (3) are negatively charged. Preferably, in such a charge retaining ceramic portion (3), one of the charges can be retained, in particular on the entire surface thereof.

The "metal" that can be contained in the internal electrode (4) may be a metal (for example, a single metal) or an alloy that can be composed of metal elements to be described below.

The metal or alloy that can be contained in the internal electrode (4) may be a sintered body. In the internal electrode (4), a single metal composed of a sintered body may be used. In other words, the electrode (that is, "internal electrode" in the first embodiment) of the structure of the present disclosure may be a sintered body. That is, in a preferred embodiment, the internal electrode is a sintered electrode. Also, in the case of such a sintered electrode, a flexible member is provided on the outer side of the internal electrode in the structure of the present disclosure, and the flexible member suitably contributes to the flexibility and/or the bendability of the structure.

In the present disclosure, the "sintered body" may generally be a sintered body (inorganic solid material body) obtained by hardening an inorganic substance (for example, a paste of a composition containing an inorganic substance) through heat treatment. For example, the electrode ("internal electrode" in the first embodiment) of the structure of the present disclosure may be a sintered body formed by hardening a raw material powder (preferably, an inorganic powder such as a metal raw material powder), a paste obtained from the raw material powder, or the like through heat treatment.

Examples of the "metal" that can be contained in the electrode ("internal electrode" in the first embodiment) in the structure of the present disclosure include at least one selected from the group consisting of gold (Au), silver (Ag), copper (Cu), iron (Fe), aluminum (Al), chromium (Cr), titanium (Ti), nickel (Ni), palladium (Pd), and platinum (Pt).

The "conductive material" that can be included in the electrode ("internal electrode" in the first embodiment) in the structure of the present disclosure means a material having electrical conductivity, and the specific type of the material is not particularly limited as long as it has electrical conductivity.

Examples of the "conductive material" include a "conductive filler". In a preferred mode, the conductive filler may be combined with a resin. That is, the conductive material that can be contained in the electrode ("internal electrode" in the first embodiment) in the structure of the present disclosure may be a composite of a conductive filler and a resin. When a conductive material is provided as a composite, it is easy to impart higher flexibility and/or bendability to the internal electrode (4), and thus it is easy to further improve the flexibility of the ceramic electret and the structure.

The "conductive filler" means a material or a substance capable of imparting conductivity to (facilitating passage of electricity/electrons through) a polymer material such as a resin, and the specific type of the material or substance is not particularly limited as long as it can impart conductivity. Examples of the conductive filler include carbon-based, metal-based and/or metal oxide-based conductive fillers. The conductive filler may be, for example, a conductive filler containing carbon black, acetylene black, Ketjen black, a nanocarbon material, gold, silver, platinum, nickel, copper, zinc, aluminum, tin, manganese, stainless steel, tin oxide, indium oxide, zinc oxide, zinc nickel oxide, magnesium, tungsten, cobalt, chromium, and/or titanium.

The "resin" means, for example, a polymer material. The specific type of the resin is not particularly limited, and a thermoplastic resin and/or a thermosetting resin and the like may be included in the electrode ("internal electrode" in the first embodiment) in the structure of the present disclosure. The resin may be, for example, a resin having a volume resistivity of $10^{14}$ [Ω·m] or less (resistivity under temperature and humidity conditions where temperature is 23±5° C. and relative humidity is 50±20%). For example, a resin such as a phenol resin, an epoxy resin, a bismaleimide resin, a vinyl chloride-based resin, a urethane resin, a nylon resin, an ether resin, a polyether resin, a ketone resin, a wholly aromatic polyester resin, a polyamide resin, a polyester resin, an acrylic resin, a polymethyl methacrylate resin, a melamine resin, and/or a silicone resin may be included in the electrode ("internal electrode" in the first embodiment) in the structure of the present disclosure.

The "composite" in the present disclosure means a material in which two or more types of materials are composited, that is, a composite material. For example, the composite may be a composite of the "conductive filler" and the "resin" described above. However, the present disclosure is not necessarily limited to the filler form. That is, the electrode ("internal electrode" in the first embodiment) of the structure of the present disclosure preferably contains a composite material, and the composite material may contain a metal component, an alloy component and/or a carbon component, and a resin component. In the present disclosure, such a composite material may be a mixture (or a blended product) obtained by simply mixing (or blending) two or more types of materials.

The ratio of the conductive filler to the resin (conductive filler/resin) in the composite used for the electrode of the structure is, for example, 99/1 to 1/99, preferably 80/20 to 40/60 on a weight basis.

The shape of the internal electrode (4) is not particularly limited, and may have a plate shape or a sheet shape when more emphasis is placed on the charge density.

That is, the internal electrodes (4) may extend on the same plane. For example, the internal electrode (4) may have a layer shape (preferably in the form of a layer extending on the same plane or in the form of a layer extending on a curved surface). Similarly, when more emphasis is placed on the charge density, the internal electrode (4) may have an elongated shape, for example, a strip shape (preferably a long and narrow strip shape). Alternatively, when more emphasis is placed on the flexibility and/or the bendability, the internal electrode (4) may have a fiber shape (particularly a long and narrow shape). The sectional shape (for example, an outer contour in a sectional view) of the internal electrode (4) may be square, rectangular, or circular, and may be any other geometric shape.

The internal electrode (4) preferably has flexibility and/or bendability. For example, the thickness (thickness dimension in a sectional view) of the internal electrode (4) may be a thickness of 2 mm or less, a thickness of 1.5 mm or less, a thickness of 1 mm or less, a thickness of 0.1 mm or less, or a thickness of 0.05 mm or less, and may be, for example, 0.005 mm to 2 mm, 0.005 mm to 1.5 mm, 0.01 mm to 1 mm, 0.01 mm to 0.5 mm, 0.01 mm to 0.3 mm, 0.01 mm to 0.1 mm, or 0.01 mm to 0.05 mm. The internal electrode (4) having such a thickness tends to exhibit suitable flexibility and/or bendability. The thickness of the internal electrode (4) may be larger than the thickness of the charge retaining ceramic portion (3).

The internal electrode (4) may be a member that supports the charge retaining ceramic portion (3). In this way, the strength of the ceramic electret is more easily increased by the internal electrode (4), and thus the strength of the electret (1) is more easily increased. The internal electrode (4) may also function as a shield. In such a case, the internal electrode (4) can serve as a shield member.

In the structure (10) of the present disclosure, the internal electrode (4) contains a metal and/or a conductive filler, and serves to electrically connect with the outside. For example, the charge retaining ceramic portion (3) of the structure (10) in the present disclosure is charged (electretized), and then the internal electrode (4) is grounded or GND connected, whereby in the charge retaining ceramic portion (3), either positive or negative surface potential can be provided (preferably over the surface of the charge retaining ceramic portion (3), more preferably over the entire surface thereof).

In this way, the internal electrode (4) preferably prevents, for example, the two charge retaining ceramic portions (3) illustrated in FIG. 1 from canceling out charges with each other, and a suitable flexoelectric effect (preferably a more significant flexoelectric effect) may be brought to the structure.

(Flexible Member)

In the present disclosure, the "flexible member" (2) means a member having at least flexibility. The flexible member (2) may be a member that can be polarized by the electret portion (1) described above, particularly by the charged charge retaining ceramic portion (3).

The flexible member (2) preferably contains a resin component. For example, the resin component may be a component present in the largest amount among components of the flexible member (2) (in such a case, the flexible member can also be particularly referred to as a "resin member" or a "flexible resin member"). Since the flexible member (2) contains a resin component, more suitable flexibility and chargeability can be easily imparted to the structure.

The resin that can be contained in the flexible member (2) may be a polymer material. The specific type of the resin is not particularly limited as long as the resin is a polymer material, and a thermoplastic resin and/or a thermosetting resin may be contained in the flexible member of the structure. More specific examples of the resin component of the flexible member include a phenol resin, an epoxy resin, a bismaleimide resin, a vinyl chloride-based resin, a urethane resin, a nylon resin, an ether resin, a polyether resin, a ketone resin, a wholly aromatic polyester resin, a polyamide resin, a polyester resin, an acrylic resin, a polymethyl methacrylate resin, a melamine resin, a silicone resin, and a fluorine-based resin (e.g. polyvinylidene fluoride (PVDF) and/or polytetrafluoroethylene (PTFE)).

The thickness (thickness dimension in a sectional view) of the flexible member (2) may be 10 mm or less or 5 mm or less, and may be, for example, a thickness of 0.05 mm to 10 mm, 0.05 mm to 8 mm, 0.1 mm to 5 mm, 0.5 mm to 5 mm, 0.5 mm to 4 mm, 0.5 mm to 3 mm, or 0.5 mm to 2 mm. When the thickness of the flexible member (2) is within the above range, the flexible member (2) is easily deformed in conformity with the electret portion (1), and more suitable flexibility and/or bendability is easily provided to the structure. From the viewpoint that the flexibility and/or the bendability of the structure can be more apparent, the thickness of the flexible member (2) (the thickness of each layer forming the layer) is preferably larger than the thickness of the internal electrode (4).

When the thickness of the flexible member (2) is within the above range, it becomes easy to provide the flexible member as a member having a thickness relatively larger than that of the electret portion (1), and the amount of deformation or displacement of the flexible member can be made larger than that of the electret portion (1). Because of this, a more suitable flexoelectric effect (for example, a larger flexoelectric effect) is easily provided to the structure.

(Ceramic Component)

As described above, the electret of the structure of the present disclosure contains a ceramic component. In particular, the charge retaining ceramic portion provided in the ceramic electret of the structure contains a ceramic component. In the present disclosure, the "ceramic component" means an inorganic compound component (oxides, carbides and/or nitrides) containing a metal element. For example, the ceramic component may correspond to a sintered body (inorganic solid material body) obtained by hardening an inorganic substance (preferably, a paste of a composition containing an inorganic substance) as a raw material thereof through heat treatment.

Specific examples of the "ceramic component" include ceramics such as alumina (aluminum oxide), zirconia (zirconium oxide), tricalcium phosphate, and/or apatite. For example, the ceramic component of the ceramic electret may be a component that can be used as a ceramic-based biomaterial. In particular, apatite having biocompatibility as a biomaterial and having high mechanical strength, fracture toughness, excellent electronic properties, and the like may be used for the structure (in particular, the ceramic electret) of the present disclosure. In such a case, specificity can be provided in that apatite, which is a ceramic known as a biomaterial, is used in the field of electrets and the like.

"Apatite" is a ceramic known as a calcium phosphate-based functional inorganic material, and typically contains phosphorus (P) and calcium (Ca) as main components. Apatite generally has high mechanical strength and fracture toughness, and is excellent in electronic properties, biocompatibility, ion exchangeability, surface adsorption, optical properties, and the like.

In the structure (10) of the present disclosure, by using such a material in the ceramic electret, it becomes easy to impart high mechanical strength and fracture toughness to the electret portion (1), and it becomes easy to impart electronic properties such as development and control of flexibility and/or charge retaining capability.

The "apatite" is preferably at least one selected from the group consisting of fluoroapatite, chloroapatite, and hydroxyapatite. Among them, hydroxyapatite is particularly preferably used. Specificity can be provided in that hydroxyapatite, which is a ceramic known as a biomaterial, is used in the field of electrets and the like. Hydroxyapatite can impart not only high mechanical strength and fracture toughness but also excellent electronic properties such as charge retaining ability to the structure of the present disclosure.

The specific type of "fluoroapatite" (FAp) is not limited. For example, the fluoroapatite is not particularly limited, but may be one represented by the chemical formula: $Ca_5(PO_4)_3F$. Fluoroapatite, called "FAp", may be used.

The specific type of "chloroapatite" (CAp) is not limited. For example, the chloroapatite is not particularly limited, but may be one represented by the chemical formula: $Ca_5(PO_4)_3Cl$. Chloroapatite, also called "CAp", may be used.

The specific type of "hydroxyapatite" (HAp) is not limited. For example, the hydroxyapatite is not particularly limited, but may be one represented by the chemical formula: $Ca_5(PO_4)_3OH$. Hydroxyapatite, also called "HAp", may be used.

In other words, the "ceramic component" in the present disclosure is not particularly limited as long as it is a component (element) that can constitute a ceramic (ceramic crystals, in particular metal oxides). For example, the ceramic electret may contain a ceramic component composed of at least one selected from the group consisting of lithium (Li), sodium (Na), potassium (K), magnesium (Mg), calcium (Ca), strontium (Sr), barium (Ba), yttrium (Y), zirconium (Zr), titanium (Ti), vanadium (V), chromium (Cr), manganese (Mn), iron (Fe), cobalt (Co), nickel (Ni), copper (Cu), zinc (Zn), boron (B), aluminum (Al), silicon (Si), indium (In), tin (Sn), antimony (Sb), barium (Ba), tantalum (Ta), tungsten (W), lead (Pb), bismuth (Bi), lanthanum (La), cesium (Ce), neodymium (Nd), samarium (Sm), gadolinium (Gd), dysprosium (Dy), holmium (Ho), erbium (Er), oxygen (O), carbon (C), nitrogen (N), sulfur (S), phosphorus (P), fluorine (F), and chlorine (Cl). Moreover, the ceramic component may be, for example, lead, zirconium, titanium and oxygen, or titanium, barium and oxygen, or bismuth, sodium, titanium and oxygen, or zirconium and oxygen, or yttrium, zirconium and oxygen.

A glass component may be contained as a ceramic component of the ceramic electret. Examples of the glass component include at least one selected from the group consisting of soda lime glass, potash glass, borate glass, borosilicate glass, barium borosilicate glass, zinc borate glass, barium borate glass, bismuth borosilicate glass, bismuth zinc borate glass, bismuth silicate glass, phosphate glass, aluminophosphate glass, and zinc phosphate glass.

In the ceramic electret, the ceramic component may include crystal grains or microcrystals. Among them, the component of the ceramic electret may be lead zirconate titanate (PZT), barium titanate ($BaTiO_3$) (BT), sodium bismuth titanate (($Bi_{1/2}Na_{1/2}$)$TiO_3$) (BNT), zirconia, yttrium-stabilized zirconia, or glass, and crystal grains or microcrystals containing such a component may be contained in the ceramic electret.

In the present disclosure, the "charge retaining ceramic portion" (3) is a portion or member containing the above ceramic component. Thus, the charge retaining ceramic portion (3) may be composed of the ceramic component, or may be a composite composed of the ceramic component and other components such as a resin. When the charge retaining ceramic portion (3) includes a composite, it is easier to impart flexibility and/or bendability to the charge retaining ceramic portion (3), which in turn makes the ceramic electret and the structure more flexible.

The term "composite" means two or more types of materials, and as for the "charge retaining ceramic portion" (3), it means a material (composite material) in which at least "ceramic component" and "other component" are composited. The composite used in the charge retaining ceramic portion (3) may be a mixture (or blended product) of two or more materials simply mixed (or blended).

The "resin" provided as another component of the composite used in the charge retaining ceramic portion (3) may be a polymeric material. The specific type of the resin is not particularly limited as long as the resin is a polymer material, and a thermoplastic resin and/or a thermosetting resin may be contained in the charge retaining ceramic portion. For example, a resin component such as a phenol resin, an epoxy resin, a bismaleimide resin, a polypropylene resin, a polyimide resin, a polyamideimide resin, and/or an acrylonitrile resin may be contained in the charge retaining ceramic portion. The ratio of the ceramic component to the resin (ceramic component/resin) of the composite contained in the charge retaining ceramic portion is, on a volume basis, for example, in the range of 99/1 to 1/99, preferably 64/36 to 1/99, more preferably 30/70 to 1/99, and still more preferably 20/80 to 1/99.

Advantageous Effect

The electret portion (1) provided as a ceramic electret containing a ceramic component is composed of a charge retaining ceramic portion (3) and an internal electrode (4), and it is easy to improve (preferably significantly improve) the strength and/or the charge density of the flexoelectret structure as compared with a conventional polymer electret.

In the structure of the present disclosure, a flexible member (2) is provided outside the electret portion (1). More preferably, the flexible member (2) is provided so as to sandwich or surround the electret portion (1). For example, the flexible members (2) may be provided at positions opposed to each other in contact with the electret portion (1) (for example, as illustrated in FIG. 1, the first flexible member and the second flexible member provided as two members may be provided so as to oppose each other while each of them is in contact with one of the outer main surfaces of the electret portion (1)). As described above, the electret portion (1) in the present disclosure is easily positioned at the center of the flexoelectret structure (10). Thus, while the electret portion (1) can be a member that is relatively less likely to be deformed with respect to the flexible member (2), the flexible member (2) is relatively likely to be deformed with respect to the electret portion (1). In other words, the electret portion (1) can have a relatively high Young's modulus (for example, an apparent Young's modulus) with respect to the flexible member (2), while the flexible member (2) can have a relatively low Young's modulus (for example, an apparent Young's modulus) with respect to the electret portion (1). When it is assumed that the structure is subjected to bending, it can be said that the flexible member (2) is displaced more suitably. Thus, in the flexoelectret structure of the present disclosure, the flexible member (2) can be displaced largely (preferably, displaced selectively largely), and a larger strain gradient is easily provided to the flexible member (2). As a result, the structure of the present disclosure can exhibit a more suitable (preferably more significant) flexoelectric effect, and can achieve a larger electromotive force (can achieve increase in power generation amount, increase in sensor sensitivity, and the like). Although not bound by a specific theory, the Young's modulus in the conventional polymer flexoelectret can be uniform, which can be different from the development of flexoelectric as described above.

Furthermore, conventional polymer electrets have the disadvantage that they lose charge when exposed to high temperatures. Moreover, when water and/or an organic solvent adheres, they shield an electric field, whereby an electric field cannot be formed outside. In this regard, a flexoelectret structure (10) of the present disclosure includes an electret portion (1), particularly a charge retaining ceramic portion (3), and a flexible member (2) covering the charge retaining ceramic portion (3). Thus, the flexible member (2) can suitably protect the charge retaining ceramic portion (3) from water and/or an organic solvent. In other words, the flexible member (2) can function as a protective layer. As a result, the structure (10) of the present disclosure can exhibit more suitable durability such as weather resistance (preferably, durability such as more improved weather resistance) than conventional polymer electrets, and can be used also in a more severe high-temperature environment (for example, a car or the like) including outdoors.

(Modification of Structure 10)

Figure 2:
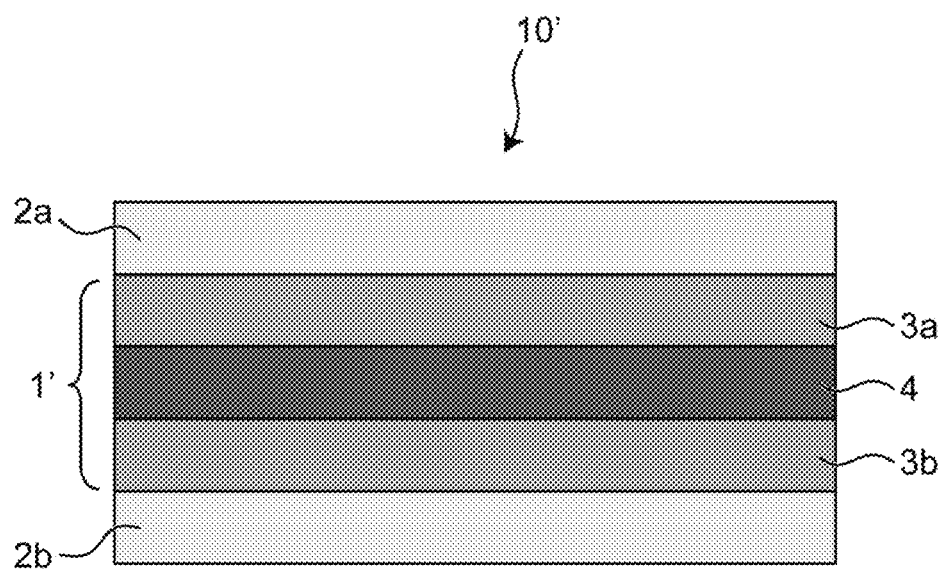
FIG. 2 is a schematic sectional view schematically illustrating a modification of the structure according to the first embodiment of the present disclosure.

FIG. 2 illustrates a structure 10' as a modification of the structure according to the first embodiment. The structure 10' may basically correspond to the structure 10 shown in FIG. 1.

An electret portion 1' that can be included in the structure 10' illustrated in FIG. 2 can correspond to the electret portion 1 of the structure 10 illustrated in FIG. 1. The modification of FIG. 2 corresponds to a mode in which the constituent elements of the structure are composed of sub members. For example, in the structure 10' in FIG. 2, the charge retaining ceramic portion is composed of a plurality of sub members. Specifically, in the structure 10' illustrated in FIG. 2, the charge retaining ceramic portion 3 included in the electret portion 1 is composed of at least a first charge retaining ceramic layer 3a and a second charge retaining ceramic layer 3b, and an internal electrode 4 is positioned between the first charge retaining ceramic layer 3a and the second charge retaining ceramic layer 3b similarly to the structure 10 illustrated in FIG. 1.

The first charge retaining ceramic layer 3a and the second charge retaining ceramic layer 3b can be configured similarly to the charge retaining ceramic layer 3 included in the electret portion 1 of the structure 10 illustrated in FIG. 1.

The first charge retaining ceramic layer 3a and the second charge retaining ceramic layer 3b may be made of the same material. Alternatively, the first charge retaining ceramic layer 3a and the second charge retaining ceramic layer 3b may be made of materials different from each other. In both cases, since the internal electrode 4 is positioned between the first charge retaining ceramic layer 3a and the second charge retaining ceramic layer 3b, in the first charge retaining ceramic layer 3a and the second charge retaining ceramic layer 3b, particularly the surfaces thereof can be charged either positively or negatively, and a more suitable electric effect (preferably a more significant electric effect) can be provided. For example, the surfaces of the first charge retaining ceramic layer 3a and the second charge retaining ceramic layer 3b may both have the same sign (+ or −) of charge, which may provide a more suitable electrical effect (preferably a more significant electrical effect) at least in that respect.

The thicknesses of the first charge retaining ceramic layer 3a and the second charge retaining ceramic layer 3b may be the same as each other. Alternatively, the thicknesses of the first charge retaining ceramic layer 3a and the second charge retaining ceramic layer 3b may be different from each other.

Since the structure 10' includes the first charge retaining ceramic layer 3a and the second charge retaining ceramic layer 3b in the electret portion 1', the Young's modulus (for example, the apparent Young's modulus) in the central portion of the structure 10' easily increases, and the strength of the structure is easily improved together with the flexible member.

In the structure 10' illustrated in FIG. 2, the flexible member 2 is also composed of a plurality of sub members. More specifically, in the structure 10' illustrated in FIG. 2, the flexible member 2 is composed of at least a first flexible member 2a and a second flexible member 2b, and the electret portion 1' is positioned between the first flexible member 2a and the second flexible member 2b.

The first flexible member 2a and the second flexible member 2b may be made of the same material. Alternatively, the first flexible member 2a and the second flexible member 2b may be made of materials different from each other. In both cases, the first flexible member 2a and the second flexible member 2b in FIG. 2 can be configured similarly to the flexible member 2 included in the structure 10 illustrated in FIG. 1.

In the structure 10', the thicknesses of the first flexible member 2a and the second flexible member 2b may be the same as each other. Alternatively, the thicknesses of the first flexible member 2a and the second flexible member 2b may be different from each other.

In the structure 10' illustrated in FIG. 2, the first charge retaining ceramic layer 3a, the second charge retaining ceramic layer 3b, and the internal electrode 4 included in the electret portion 1', the first flexible member 2a, and the second flexible member 2b may each have a plate shape or a sheet shape. For example, each of these members may have a form in which each member extends on the same plane. For example, the structure 10' may be provided as a laminate formed by laminating the first charge retaining ceramic layer 3a, the second charge retaining ceramic layer 3b, the internal electrode 4, the first flexible member 2a, and the second flexible member 2b on one another. The first charge retaining ceramic layer 3a, the second charge retaining ceramic layer 3b, the internal electrode 4, the first flexible member 2a, and the second flexible member 2b may have an elongated shape, for example, a strip shape (particularly, a long and narrow strip shape). In such a shape, the structure 10' illustrated in FIG. 2 easily has a plate shape or a sheet shape as a whole, and a more suitable electric effect (preferably, a more significant electric effect) is easily provided due to the higher charge density.

Second Embodiment

Figure 3:
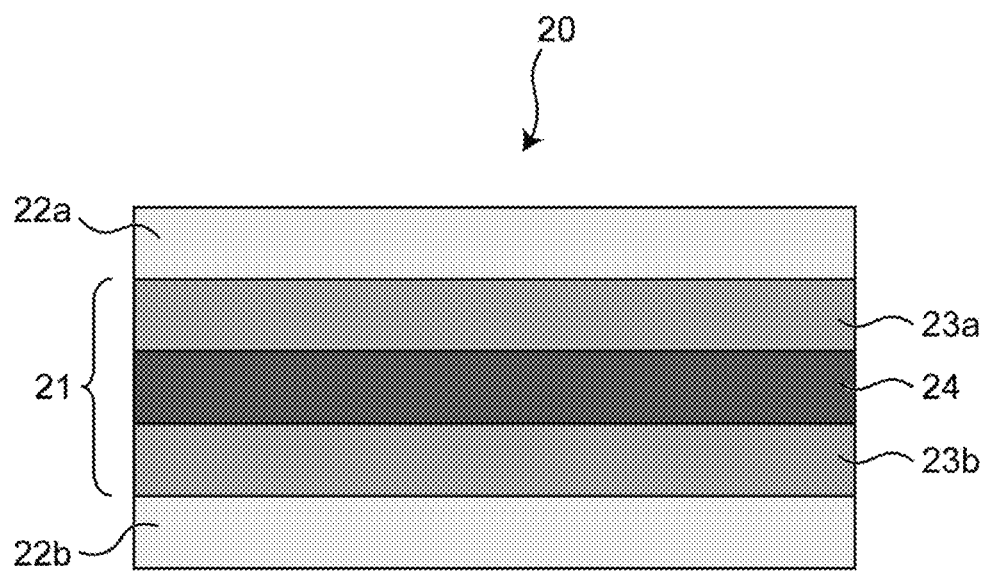
FIG. 3 is a schematic sectional view schematically illustrating a structure according to a second embodiment of the present disclosure.

FIG. 3 illustrates a structure 20 according to the second embodiment. The structure 20 may basically correspond to the structure 10 shown in FIG. 1. An electret portion 21 included in the structure 20 illustrated in FIG. 3 can correspond to the electret portion 1 of the structure 10 illustrated in FIG. 1. The second embodiment corresponds to a mode in which the constituent elements of the structure are composed of sub members, and the flexible member is formed of a resin member.

In the structure 20, the charge retaining ceramic portion 3 included in the electret portion 1 of the structure 10 illustrated in FIG. 1 is composed of at least a first charge retaining ceramic layer 23a and a second charge retaining ceramic layer 23b, and an internal electrode 24 is positioned between the first charge retaining ceramic layer 23a and the second charge retaining ceramic layer 23b. With such a configuration, the Young's modulus (for example, the apparent Young's modulus) at the central portion of the structure 20 easily increases, and the strength of the structure is easily improved together with the flexible member.

The first charge retaining ceramic layer 23a and the second charge retaining ceramic layer 23b can be configured similarly to the charge retaining ceramic portion 3 of the structure 10 illustrated in FIG. 1. In the structure 20 illustrated in FIG. 3, similarly to the structure described above, the first charge retaining ceramic layer 23a and the second charge retaining ceramic layer 23b may be made of the same material or different materials. Similarly, the thicknesses of the first charge retaining ceramic layer 23a and the second charge retaining ceramic layer 23b may be the same or different.

The internal electrode 24 illustrated in FIG. 3 can also be configured similarly to the internal electrode 4 of the structure 10 illustrated in FIG. 1.

In the structure 20 illustrated in FIG. 3, the flexible member is composed of at least a first resin layer 22a and a second resin layer 22b, and the electret portion 21 is positioned between the first resin layer 22a and the second resin layer 22b. Since the first resin layer 22a and the second resin layer 22b can have a Young's modulus relatively lower than that of the electret portion 21, the first resin layer and the second resin layer are likely to be largely displaced (preferably, are likely to be selectively largely displaced), and a larger strain gradient can be generated. Because of this, the electromotive force generated in the structure 20 tends to increase.

Each of the first resin layer 22a and the second resin layer 22b may be a layer containing the above-described resin component. That is, each of the first resin layer 22a and the second resin layer 22b may be a member containing the above-described resin component.

In the structure 20 illustrated in FIG. 3, the first resin layer 22a and the second resin layer 22b may be made of the same material. Alternatively, the first resin layer 22a and the second resin layer 22b may be made of materials different from each other. The thicknesses of the first resin layer 22a and the second resin layer 22b may be the same as each other. Alternatively, the thicknesses of the first resin layer 22a and the second resin layer 22b may be different from each other.

In the structure 20 illustrated in FIG. 3, each of the first charge retaining ceramic layer 23a, the second charge retaining ceramic layer 23b, and the internal electrode 24 included in the electret portion 21, the first resin layer 22a, and the second resin layer 22b may have a plate shape or a sheet shape. For example, each of these members may have a form in which each member extends on the same plane. For example, the structure 20 may be provided as a laminate formed by laminating the first charge retaining ceramic layer 23a, the second charge retaining ceramic layer 23b, the internal electrode 24, the first resin layer 22a, and the second resin layer 22b on one another. The first charge retaining ceramic layer 23a, the second charge retaining ceramic layer 23b, the internal electrode 24, the first resin layer 22a, and the second resin layer 22b may have an elongated shape, for example, a strip shape (particularly, a long and narrow strip shape). By having such a shape, the structure 20 illustrated in FIG. 3 easily has a plate shape or a sheet shape as a whole, and a more suitable electric effect (preferably, a more significant electric effect) is easily provided due to the higher charge density.

Third Embodiment

Figure 4:
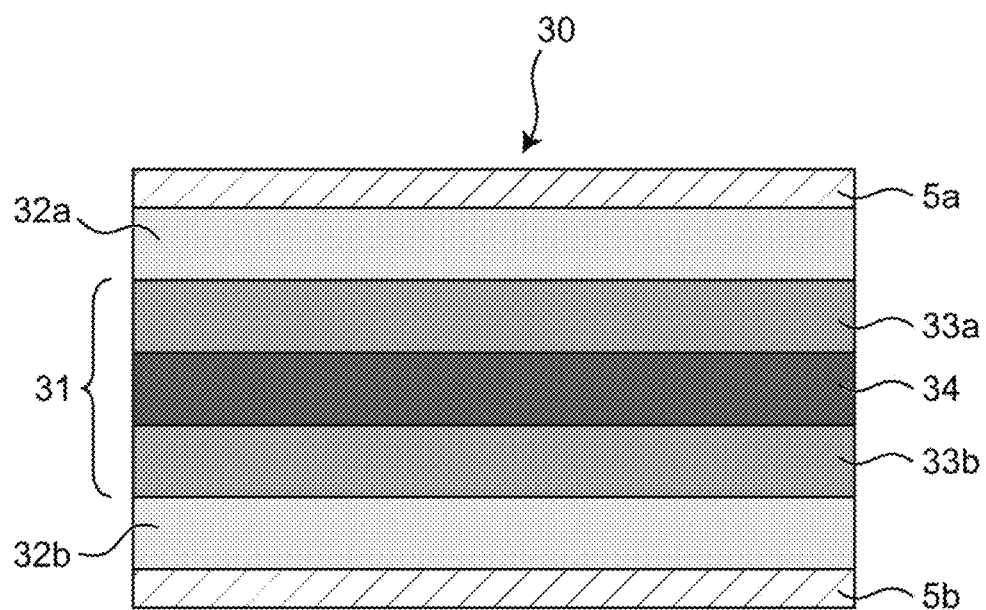
FIG. 4 is a schematic sectional view schematically illustrating a structure according to a third embodiment of the present disclosure.

FIG. 4 illustrates a structure 30 according to the third embodiment. The structure 30 may basically correspond to the structure 20 illustrated in FIG. 3. An electret portion 31 included in the structure 30 illustrated in FIG. 4 can correspond to the electret portion 21 of the structure 20 illustrated in FIG. 3. The third embodiment corresponds to a mode in which constituent elements of a structure are composed of sub members, the flexible member is formed of a resin member, and an external electrode is additionally provided.

The electret portion 31 includes at least a first charge retaining ceramic layer 33a and a second charge retaining ceramic layer 33b, and an internal electrode 34 is positioned between the first charge retaining ceramic layer 33a and the second charge retaining ceramic layer 33b.

The first charge retaining ceramic layer 33a and the second charge retaining ceramic layer 33b can be configured similarly to the first charge retaining ceramic layer 23a and the second charge retaining ceramic layer 23b of the structure 20 illustrated in FIG. 3, respectively. In the structure 30 illustrated in FIG. 4, similarly to the structure described above, the first charge retaining ceramic layer 33a and the second charge retaining ceramic layer 33b may be made of the same material or different materials. Similarly, the thicknesses of the first charge retaining ceramic layer 33a and the second charge retaining ceramic layer 33b may be the same as or different from each other.

The internal electrode 34 illustrated in FIG. 4 can be configured similarly to the internal electrode 24 of the structure 20 illustrated in FIG. 3.

The structure 30 illustrated in FIG. 4 includes a first resin layer 32a and a second resin layer 32b, and the electret portion 31 is positioned between the first resin layer 32a and the second resin layer 32b.

The first resin layer 32a and the second resin layer 32b can be configured similarly to the first resin layer 22a and the second resin layer 22b of the structure 20 illustrated in FIG. 3, respectively. In the structure 30 illustrated in FIG. 4, the first resin layer 32a and the second resin layer 32b may be made of the same material or different materials. The thicknesses of the first resin layer 32a and the second resin layer 32b may be the same as or different from each other.

The structure 30 according to the third embodiment illustrated in FIG. 4 includes a first external electrode 5a on at least a part of the outer surface of the first resin layer 32a, and a second external electrode 5b on at least a part of the outer surface of the second resin layer 32b.

Each of the first external electrode 5a and the second external electrode 5b may be an electrode for extracting the charge generated by the flexoelectric effect in the structure 30 or for measuring a generated potential.

The materials of the first external electrode 5a and the second external electrode 5b may contain a conductive resin (for example, a volume resistivity of $10^{14}$ [Ω·m] or less (resistivity under temperature and humidity conditions where temperature is 23±5° C. and relative humidity is 50±20%)). The conductive resins may be, for example, a thermoplastic resin and/or a thermosetting resin. The materials of the first external electrode 5a and the second external electrode 5b may be a composite composed of a conductive filler and a resin. In such a case, the conductive filler may be a filler containing a component such as carbon black, acetylene black, Ketjen black, a nanocarbon material, gold, silver, platinum, nickel, copper, zinc, aluminum, tin, manganese, stainless steel, tin oxide, indium oxide, zinc oxide, zinc nickel oxide, magnesium, tungsten, cobalt, chromium, and/or titanium. The resin may be, for example, a phenol resin, an epoxy resin, a bismaleimide resin, a vinyl chloride-based resin, a urethane resin, a nylon resin, an ether resin, a polyether resin, a ketone resin, a wholly aromatic polyester resin, a polyamide resin, a polyester resin, an acrylic resin, a polymethyl methacrylate resin, a melamine resin and/or a silicone resin.

A conventionally known electrode material may be used for the first external electrode 5a and the second external electrode 5b. For example, the first external electrode 5a and the second external electrode 5b may be formed of a metal element such as at least one selected from the group consisting of gold (Au), silver (Ag), copper (Cu), iron (Fe), aluminum (Al), chromium (Cr), titanium (Ti), nickel (Ni), palladium (Pd), and platinum (Pt). Alternatively, the first external electrode 5a and the second external electrode 5b may be made of a metal oxide film such as ITO.

The shapes of the first external electrode 5a and the second external electrode 5b are not particularly limited, and may be, for example, a plate shape. Preferably, the first external electrode 5a and the second external electrode 5b have a thin film shape or a sheet shape.

The first external electrode 5a may be disposed on at least a part or the entire outer surface of the first resin layer 32a, and is preferably disposed at the geometrical center of the outer surface of the first resin layer 32a.

The second external electrode 5b may be disposed on at least a part or the entire outer surface of the second resin layer 32b, and is preferably disposed at the geometrical center of the outer surface of the second resin layer 32b.

The thickness of each of the first external electrode 5a and the second external electrode 5b is, for example, 1 nm to 0.01 mm. When the thickness is within the above range, it is easy to successfully extract charges while the flexibility of the structure is maintained. The thicknesses of the first external electrode 5a and the second external electrode 5b may be smaller than the thicknesses of the first resin layer 32a and the second resin layer 32b. In a preferred mode, the thicknesses of the first external electrode 5a and the second external electrode 5b are smaller than the respective thicknesses of any one, any two, any three, any four, or all of the first charge retaining ceramic layer 33a, the second charge retaining ceramic layer 33b, the internal electrode 34, the first resin layer 32a, and the second resin layer 32b.

In the structure 30 illustrated in FIG. 4, each of the first charge retaining ceramic layer 33a, the second charge retaining ceramic layer 33b, and the internal electrode 34 included in the electret portion 31, the first resin layer 32a, the second resin layer 32b, the first external electrode 5a, and the second external electrode 5b preferably has a plate shape or a sheet shape. For example, each of these members may have a form in which each member extends on the same plane. The structure 30 may be provided as a laminate formed by laminating the first charge retaining ceramic layer 33a, the second charge retaining ceramic layer 33b, the internal electrode 34, the first resin layer 32a, the second resin layer 32b, the first external electrode 5a, and the second external electrode 5b on one another. The first charge retaining ceramic layer 33a, the second charge retaining ceramic layer 33b, the internal electrode 34, the first resin layer 32a, the second resin layer 32b, the first external electrode 5a, and the second external electrode 5b may have an elongated shape, for example, a strip shape (particularly, a long and narrow strip shape). By having such a shape, the structure 30 illustrated in FIG. 4 easily has a plate shape or a sheet shape as a whole, and a more suitable electric effect (preferably, a more significant electric effect) is easily provided due to the higher charge density.

Fourth Embodiment

Figure 5:
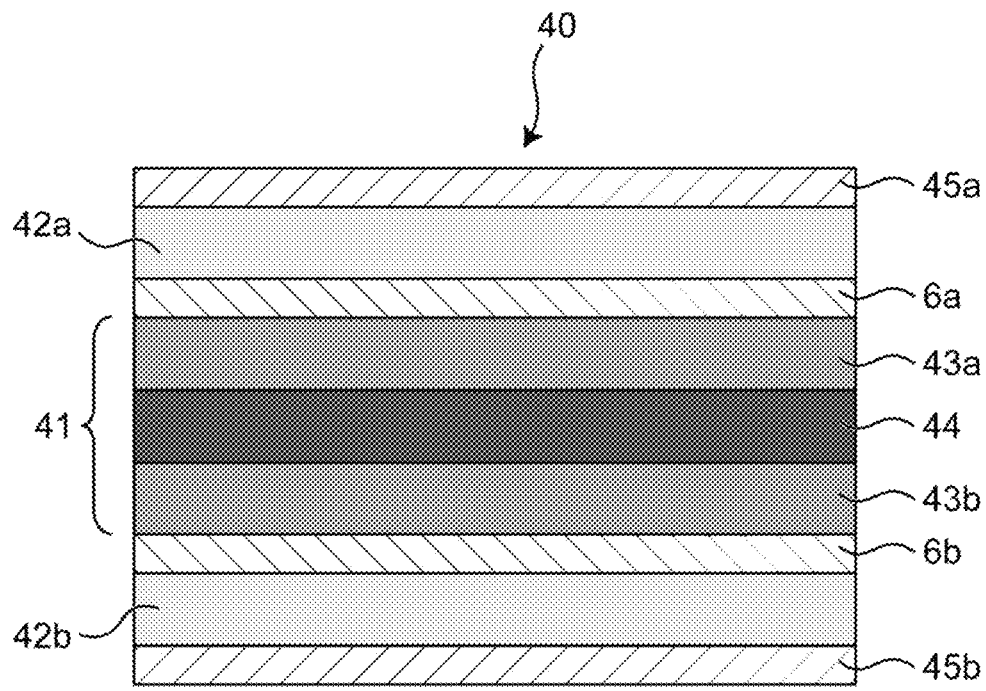
FIG. 5 is a schematic sectional view schematically illustrating a structure according to a fourth embodiment of the present disclosure.

FIG. 5 illustrates a structure 40 according to the fourth embodiment. The structure 40 may basically correspond to the structure 30 illustrated in FIG. 4. An electret portion 41 included in the structure 40 illustrated in FIG. 5 can correspond to the electret portion 31 of the structure 30 illustrated in FIG. 4. The fourth embodiment particularly corresponds to a mode including a polarization electrode as an auxiliary electrode.

The electret portion 41 includes at least a first charge retaining ceramic layer 43a and a second charge retaining ceramic layer 43b, and an internal electrode 44 is positioned between the first charge retaining ceramic layer 43a and the second charge retaining ceramic layer 43b.

The first charge retaining ceramic layer 43a and the second charge retaining ceramic layer 43b can be configured similarly to the first charge retaining ceramic layer 33a and the second charge retaining ceramic layer 33b of the structure 30 illustrated in FIG. 4, respectively. In the structure 40 illustrated in FIG. 5, similarly to the structure described above, the first charge retaining ceramic layer 43a and the second charge retaining ceramic layer 43b may be made of the same material or different materials. Similarly, the thicknesses of the first charge retaining ceramic layer 43a and the second charge retaining ceramic layer 43b may be the same as or different from each other.

The internal electrode 44 illustrated in FIG. 5 can be configured similarly to the internal electrode 34 of the structure 30 illustrated in FIG. 4.

The structure 40 includes a first resin layer 42a and a second resin layer 42b, and the electret portion 41 is positioned between the first resin layer 42a and the second resin layer 42b with a first polarization electrode 6a and a second polarization electrode 6b described in detail below interposed therebetween.

The first resin layer 42a and the second resin layer 42b can be configured similarly to the first resin layer 32a and the second resin layer 32b of the structure 30 illustrated in FIG. 4, respectively. In the structure 40 illustrated in FIG. 5, the first resin layer 42a and the second resin layer 42b may be made of the same material or different materials. The thicknesses of the first resin layer 42a and the second resin layer 42b may be the same as or different from each other.

The structure 40 illustrated in FIG. 5 includes a first external electrode 45a on at least a part of the outer surface of the first resin layer 42a, and a second external electrode 45b on at least a part of the outer surface of the second resin layer 42b. The first external electrode 45a and the second external electrode 45b can be configured similarly to the first external electrode 5a and the second external electrode 5b of the structure 30 illustrated in FIG. 4, respectively. In the structure 40 illustrated in FIG. 5, the first external electrode 45a and the second external electrode 45b may be made of the same material or different materials. The thicknesses of the first external electrode 45a and the second external electrode 45b may be the same as or different from each other.

The structure 40 illustrated in FIG. 5 includes a polarization electrode. Specifically, the structure further includes a polarization electrode between the resin layer and the electret portion. In the structure 40 illustrated in FIG. 5, the first polarization electrode 6a is included between the first resin layer 42a and the electret portion 41 (more specifically, between the first resin layer 42a and the first charge retaining ceramic layer 43a), and the second polarization electrode 6b is included between the second resin layer 42b and the electret portion 41 (more specifically, between the second resin layer 42b and the second charge retaining ceramic layer 43b).

The first polarization electrode 6a and the second polarization electrode 6b may be electrodes for dielectric polarization or electric polarization of the first charge retaining ceramic layer 43a and the second charge retaining ceramic layer 43b, respectively, in the structure 40.

Adding the first polarization electrode 6a and the second polarization electrode 6b as described above facilitates dielectric polarization or electric polarization of the charge retaining ceramic layer 43a and the second charge retaining ceramic layer 43b, respectively, after the structure 40 is produced.

The materials of the first polarization electrode 6a and the second polarization electrode 6b may contain a conductive resin (for example, a volume resistivity of $10^{14}$ [Ω·m] or less (resistivity under temperature and humidity conditions where temperature is 23±5° C. and relative humidity is 50±20%)). The conductive resins may be a thermoplastic resin and/or a thermosetting resin. The materials of the first polarization electrode 6a and the second polarization electrode 6b may be a composite containing a conductive filler and a resin. In such a case, the conductive filler may be a filler containing a component such as carbon black, acetylene black, Ketjen black, a nanocarbon material, gold, silver, platinum, nickel, copper, zinc, aluminum, tin, manganese, stainless steel, tin oxide, indium oxide, zinc oxide, zinc nickel oxide, magnesium, tungsten, cobalt, chromium, and/or titanium. The resin may be, for example, a phenol resin, an epoxy resin, a bismaleimide resin, a vinyl chloride-based resin, a urethane resin, a nylon resin, an ether resin, a polyether resin, a ketone resin, a wholly aromatic polyester resin, a polyamide resin, a polyester resin, an acrylic resin, a polymethyl methacrylate resin, a melamine resin and/or a silicone resin.

A conventionally known electrode material may be used for the first polarization electrode 6a and the second polarization electrode 6b. For example, the first polarization electrode 6a and the second polarization electrode 6b may be formed of at least one metal element selected from the group consisting of gold (Au), silver (Ag), copper (Cu), iron (Fe), aluminum (Al), chromium (Cr), titanium (Ti), nickel (Ni), palladium (Pd), and platinum (Pt). Alternatively, the first polarization electrode 6a and the second polarization electrode 6b may be a metal oxide film such as ITO.

The shapes of the first polarization electrode 6a and the second polarization electrode 6b are not particularly limited, but may be plate-like. Preferably, the first polarization electrode 6a and the second polarization electrode 6b have a thin film shape or a sheet shape.

The first polarization electrode 6a may be disposed on at least a part or the entire surface of the first charge retaining ceramic layer 43a.

The second polarization electrode 6b may be disposed on at least a part or the entire surface of the second charge retaining ceramic layer 43b.

The thickness of each of the first polarization electrode 6a and the second polarization electrode 6b is, for example, 1 nm to 0.01 mm. In a case where the thickness is within the above range, while flexibility is imparted to the structure, the charge retaining ceramic layer 43a and the second charge retaining ceramic layer 43b are dielectrically polarized or electrically polarized easily and successfully.

In the structure 40 illustrated in FIG. 5, each of the first charge retaining ceramic layer 43a, the second charge retaining ceramic layer 43b, and the internal electrode 44 included in the electret portion 41, the first resin layer 42a, the second resin layer 42b, the first external electrode 45a, the second external electrode 45b, the first polarization electrode 6a, and the second polarization electrode 6a may have a plate shape or a sheet shape. For example, each of these members may have a form in which each member extends on the same plane. The structure may be provided as a laminate formed by laminating the first charge retaining ceramic layer 43a, the second charge retaining ceramic layer 43b, the internal electrode 44, the first resin layer 42a, the second resin layer 42b, the first external electrode 45a, the second external electrode 45b, the first polarization electrode 6a, and the second polarization electrode 6a on one another. The first charge retaining ceramic layer 43a, the second charge retaining ceramic layer 43b, the internal electrode 44, the first resin layer 42a, the second resin layer 42b, the first external electrode 45a, the second external electrode 45b, the first polarization electrode 6a, and the second polarization electrode 6a may have an elongated shape, for example, a strip shape (particularly, a long and narrow strip shape). By having such a shape, the structure 40 illustrated in FIG. easily has a plate shape or a sheet shape as a whole, and a more suitable electric effect (preferably, a more significant electric effect) is easily provided due to the higher charge density.

Fifth Embodiment

Figure 6:
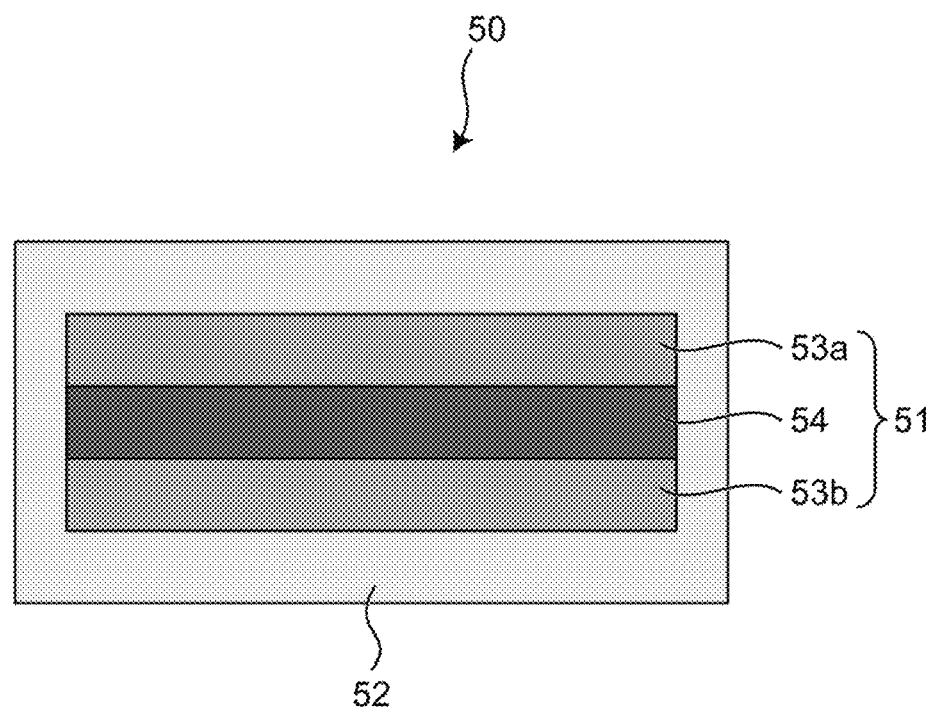
FIG. 6 is a schematic sectional view schematically illustrating a structure according to a fifth embodiment of the present disclosure.

FIG. 6 illustrates a structure 50 according to the fifth embodiment. The structure 50 may basically correspond to the structure 20 shown in FIG. 3. An electret portion 51 that can be included in the structure 50 illustrated in FIG. 6 can correspond to the electret portion 21 of the structure illustrated in FIG. 3.

The electret portion 51 includes at least a first charge retaining ceramic layer 53a and a second charge retaining ceramic layer 53b, and an internal electrode 54 is positioned between the first charge retaining ceramic layer 53a and the second charge retaining ceramic layer 53b. The first charge retaining ceramic layer 53a and the second charge retaining ceramic layer 53b can be configured similarly to the first charge retaining ceramic layer 23a and the second charge retaining ceramic layer 23b of the structure 20 illustrated in FIG. 3, respectively. In the structure 50 illustrated in FIG. 6, the first charge retaining ceramic layer 53a and the second charge retaining ceramic layer 53b may be made of the same material or different materials. The thicknesses of the first charge retaining ceramic layer 53a and the second charge retaining ceramic layer 53b may also be the same or different.

In the fifth embodiment, the electret portion is provided at an internal location of a flexible member. In the structure 50 illustrated in FIG. 6, the electret portion 51 is positioned at an internal location of a resin member or a resin layer 52. In other words, the flexible member is provided so as to surround the electret portion. A part of the electret portion 51 need not be covered with the resin member or the resin layer 52, and a part thereof may be exposed.

The resin member or the resin layer 52 may contain the above-described resin component. That is, the resin layer 52 may be a surrounding member made of the above-described resin component.

The thickness of the resin member or the resin layer 52 is, for example, 0.03 mm to 10 mm. The resin member or the resin layer 52 may or may not be uniform. When the thickness of the resin member or the resin layer 52 is within the above range, a more suitable electric effect (preferably, a more significant electric effect) is easily provided to the structure 50.

In the structure 50 illustrated in FIG. 6, as in the form illustrated in FIG. 5, an external electrode may be provided on at least a part of the outer surface of the resin layer 52 (see the external electrodes 45a and 45b illustrated in FIG. 5). A polarization electrode may be provided between the resin layer 52 and the electret portion 51, specifically, between the resin layer 52 and the charge retaining ceramic layer (53a, 53b) (see the polarization electrodes 6a and 6b illustrated in FIG. 5).

Sixth Embodiment

Figure 7:
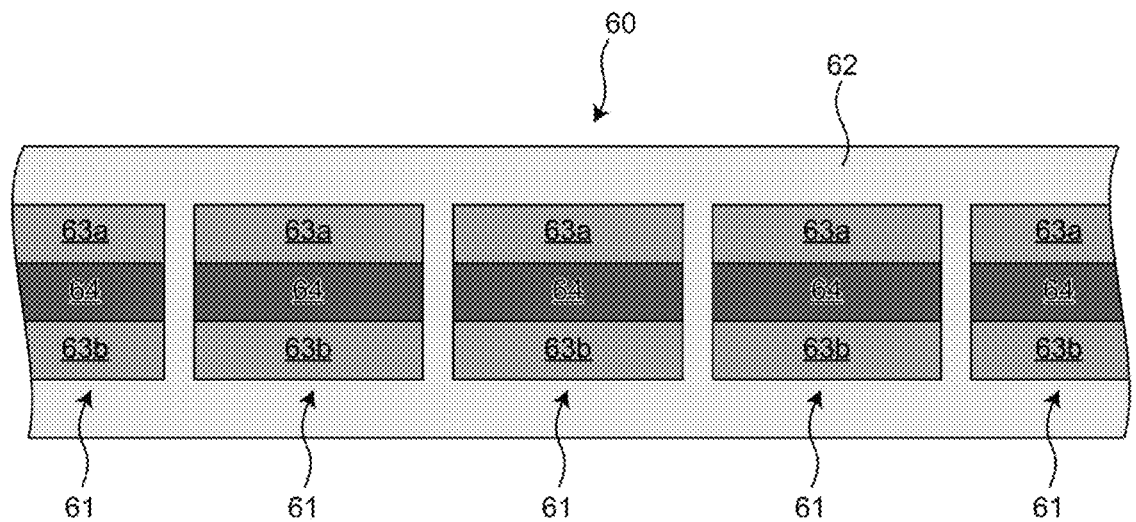
FIG. 7 is a schematic sectional view schematically illustrating a structure according to a sixth embodiment of the present disclosure.

FIG. 7 illustrates a structure 60 according to the sixth embodiment. The structure 60 can basically correspond to the structure 50 illustrated in FIG. 6, and includes a plurality of electret portions 61 instead of the electret portion 51 of the structure 50. Providing the plurality of electret portions 61 makes it easier to further improve the flexibility of the structure 60. Thus, the structure 60 according to the sixth embodiment easily copes with various deformation modes, and a more suitable electric effect (preferably, a more significant electric effect) is easily provided. The number of the plurality of electret portions 61 is not particularly limited. Further, the plurality of electret portions 61 may be the same as or different from each other.

The electret portion 61 includes at least a first charge retaining ceramic layer 63a and a second charge retaining ceramic layer 63b, and an internal electrode 64 is positioned between the first charge retaining ceramic layer 63a and the second charge retaining ceramic layer 63b. The first charge retaining ceramic layer 63a and the second charge retaining ceramic layer 63b can be configured similarly to the first charge retaining ceramic layer 53a and the second charge retaining ceramic layer 53b of the structure 50 illustrated in FIG. 6, respectively.

The internal electrode 64 illustrated in FIG. 7 can be formed using the same material as the internal electrode 54 illustrated in FIG. 6. The resin member or the resin layer 62 illustrated in FIG. 7 may contain the above-described resin component. That is, the resin layer 62 may be a surrounding member made of the above-described resin component. In the structure 60 illustrated in FIG. 7, as in the form illustrated in FIG. 5, an external electrode may be provided on at least a part of the outer surface of the resin layer 62 (see the external electrodes 45a and 45b illustrated in FIG. 5). A polarization electrode may be provided between the resin layer 62 and the electret portion 61 illustrated in FIG. 7, specifically, between the resin layer 62 and the charge retaining ceramic layer (63a, 63b) (see the polarization electrodes 6a and 6b illustrated in FIG. 5).

Seventh Embodiment

Figure 8:
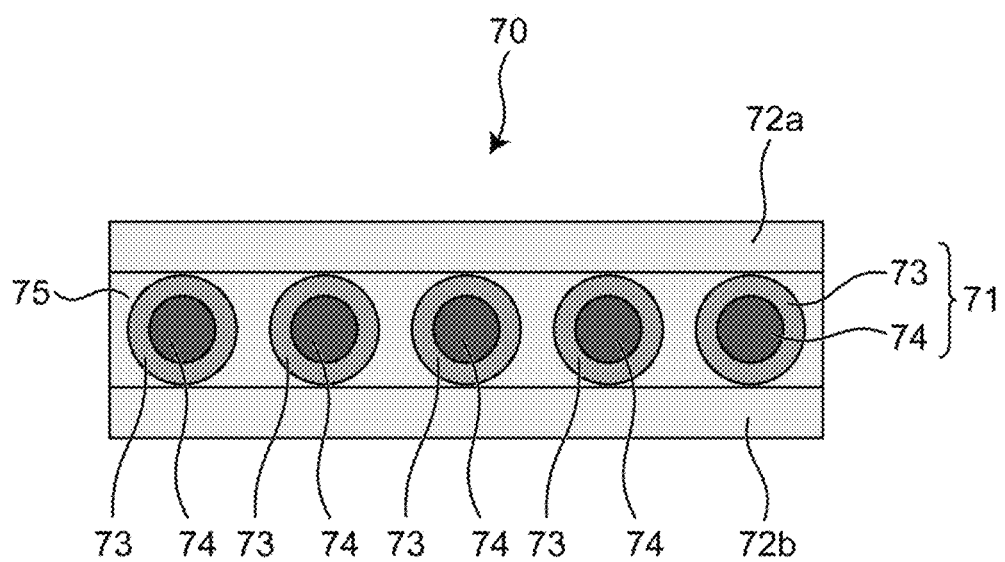
FIG. 8 is a schematic sectional view schematically illustrating a structure according to a seventh embodiment of the present disclosure.

FIG. 8 illustrates a structure 70 according to the seventh embodiment. The structure 70 can basically correspond to the structure 10 illustrated in FIG. 1, and includes a plurality of electret portions 71 formed by changing the shape of the electret portion 1 of the structure 10 in FIG. 1 to a fiber shape (preferably a long and narrow shape having a circular sectional profile or a curved sectional profile). The number of electret portions 71 is not particularly limited (hereinafter, the electret portion 71 may be referred to as an electret fiber 71).

The electret portion 71 includes a charge retaining ceramic portion 73 and an internal electrode 74 positioned at an internal location of the charge retaining ceramic portion 73. The charge retaining ceramic portion 73 and the internal electrode 74 are preferably arranged concentrically with each other (for example, arranged concentrically with each other in a sectional view as illustrated). The charge retaining ceramic portion 73 may have, for example, a cylindrical shape as a sheath part, and the electret portion 71 may have a fiber shape formed by providing the internal electrode 74 as a core part. The internal electrode 74 may be, for example, a metal wire containing the above-described metal element.

The charge retaining ceramic portion 73 can be formed using the same material as that of the charge retaining ceramic portion 3 illustrated in FIG. 1. The internal electrode 74 illustrated in FIG. 8 can be formed using the same material as the internal electrode 4 illustrated in FIG. 1. The sectional area ratio between the internal electrode 74 and the charge retaining ceramic portion 73 (internal electrode/charge retaining ceramic portion) is not particularly limited, and is, for example, 1/99 to 99/1, preferably 1/8 to 8/1.

The plurality of electret fibers 71 may be arranged in parallel with each other. A first flexible member 72a and a second flexible member 72b may be disposed as flexible members so as to sandwich the electret fiber 71 from above and below. The first flexible member 72a and the second flexible member 72b can be configured similarly to the flexible member 2 illustrated in FIG. 1.

Between the first flexible member 72a and the second flexible member 72b, a portion where the electret fiber 71 does not exist may be a cavity (that is, the hollow portion). A third flexible member 75 may be disposed between the first flexible member 72a and the second flexible member 72b. The third flexible member 75 may be similarly made of the same material as that of the flexible member 2 illustrated in FIG. 1.

The materials constituting the first flexible member 72a, the second flexible member 72b, and the third flexible member 75 may be the same as or different from each other. When more emphasis is placed on uniformly polarizing and retaining charges, the first flexible member 72a, the second flexible member 72b, and the third flexible member 75 may be formed of the same material. All of the first flexible member 72a, the second flexible member 72b, and the third flexible member 75 may be a resin member.

In the structure 70 illustrated in FIG. 8, as in the form illustrated in FIG. 5, a first external electrode may be provided on at least a part of the outer surface of the first flexible member 72a (see the first external electrode 45a illustrated in FIG. 5), and a second external electrode may be provided on at least a part of the outer surface of the second flexible member 72b (see the second external electrode 45b illustrated in FIG. 5). Further, a polarization electrode may be provided between the first flexible member 72a and the electret portion 71, more specifically, between the first flexible member 72a and the charge retaining ceramic portion 73. Similarly, a polarization electrode may be provided between the second flexible member 72b and the electret portion 71, more specifically, between the second flexible member 72b and the charge retaining ceramic portion 73.

The polarization electrode may have, for example, a cylindrical shape and be disposed in a sleeve shape outside the electret portion 71, more specifically, on the outer periphery of the charge retaining ceramic portion 73, and may be disposed concentrically with the internal electrode 74.

The thickness of the polarization electrode is, for example, 1 nm to 0.01 mm. In a case where the thickness is within the above range, while flexibility is imparted to the structure, the charge retaining ceramic portion 73 is dielectrically polarized or electrically polarized easily and successfully.

Since the structure 70 includes the plurality of electret portions having a fiber shape (electret fibers) 71, the strength of the structure 70 is maintained, the flexibility of the structure 70 is more easily improved, and a more suitable electric effect (preferably, a more significant electric effect) is easily provided.

The radius of curvature that is formed when the electret fiber 71 is bent alone is, for example, about 1000 mm or less. The tensile strength (break-elongation load) of the electret fiber 71 is, for example, about 5 kgf/mm 2 or more.

Although the electret structures of the present disclosure have been exemplified as the first to seventh embodiments, the configurations may be appropriately combined and used as necessary.

(Producing Method)

A method for producing the flexoelectret structure of the present disclosure is not particularly limited. For example, a ceramic electret (for example, the electret portion 1 illustrated in FIG. 1) including a charge retaining ceramic portion and an internal electrode positioned at an internal location of the charge retaining ceramic portion may be integrally formed using a technique such as firing. Preferably, both flexibility and strength may be enhanced by simultaneously preparing the charge retaining ceramic portion and the internal electrode through co-sintering.

The internal electrode, the external electrode, the polarization electrode, and the like may also be integrally formed using a technique such as firing. Alternatively, the internal electrode, the external electrode, the polarization electrode, and the like may be formed using a technique such as lamination, coating, plating, vapor deposition, and/or sputtering.

Moreover, the charge retaining ceramic portion may be formed using a technique such as lamination, coating, vapor deposition, and/or sputtering.

The flexible member can be formed outside the electret portion by using a technique such as resin coating and/or resin molding.

(Flexoelectric Coefficient)

As described above, the flexoelectric coefficient of the structure of the present disclosure is preferably larger than $1.3 \times 10^{-8}$ C/m. Such a "flexoelectric coefficient" in the present disclosure is calculated based on Formula (III).

$$\overline{P}_3 = \mu_{13} \frac{\overline{\partial \varepsilon_{11}}}{\partial x_3} \quad \text{(III)}$$

In the formula (III), $\overline{P}_3$ represents the average of the electric polarizations in the thickness direction, $\mu_{13}$ represents the lateral flexoelectric coefficient which is the constant of proportionality between the strain gradient in the thickness direction formed corresponding to the strain in the longitudinal direction and the polarization generated in the thickness direction, and $$\frac{\overline{\partial \varepsilon_{11}}}{\partial x_3}$$

represents the average of the strain gradients relative to the thickness direction.

$\overline{P}_3$ which is the average of the electric polarizations in the thickness direction and $\overline{\partial \varepsilon_{11}}/\partial x_3$ which is the average of the strain gradients relative to the thickness direction can be expressed by Formulae (V) and (VI), respectively.

$$\overline{P}_3 = \frac{Q}{A} \quad \text{(V)}$$

$$\frac{\overline{\partial \varepsilon_{11}}}{\partial x_3} = \frac{12a}{l^2} \quad \text{(VI)}$$

In the formula (VI),

Q represents the amount of charge generated on the electrode when the flexoelectret structure is bent in the manner of the 3-point flexure test, A represents the bottom area of the flexoelectret structure, a represents the distance pushed when the flexoelectret structure is bent in the manner of the 3-point flexure test, and l represents the length of the flexoelectret structure.

Q which is the amount of charge generated on the electrode when the flexoelectret structure is bent in the manner of the 3-point flexure test can be calculated by accumulating the value obtained by measuring the amount of current generated when the flexoelectret structure is bent in the manner of the 3-point flexure test with an ammeter. The lateral flexoelectric coefficient $\mu_{13}$ can be obtained by dividing $\overline{P}_3$ which is the average of the electric polarizations in the thickness direction calculated according to Formula (V) by $$\frac{\overline{\partial \varepsilon_{11}}}{\partial x_3}$$

which is the average of the strain gradients relative to the thickness direction calculated according to Formula (VI).

EXAMPLES

Example 1

The flexoelectret structure 10 illustrated in FIG. 1 was produced by the following procedure.

(A) Formation of Electret Portion

The electret portion 1 (thickness: 180 μm) was formed by sandwiching an internal electrode 4 (thickness: 30 μm) made of an aluminum foil with two charge retaining ceramic portions 3 (thickness: 75 μm) made of ceramic (hydroxyapatite (HAp) as a representative ceramic in this example).

(B) Formation of Flexible Member

After the surface of the charge retaining ceramic portion 3 (HAp) of the electret portion 1 was negatively (−) charged, a flexible member 2 (thickness: 1000 μm) made of a resin (PET as a representative resin in this example) was formed on the upper side of the charge retaining ceramic portion 3 (HAp) to prepare a flexoelectret structure 10 (total thickness: 2180 μm) having the form illustrated in FIG. 1.

Figure 12:
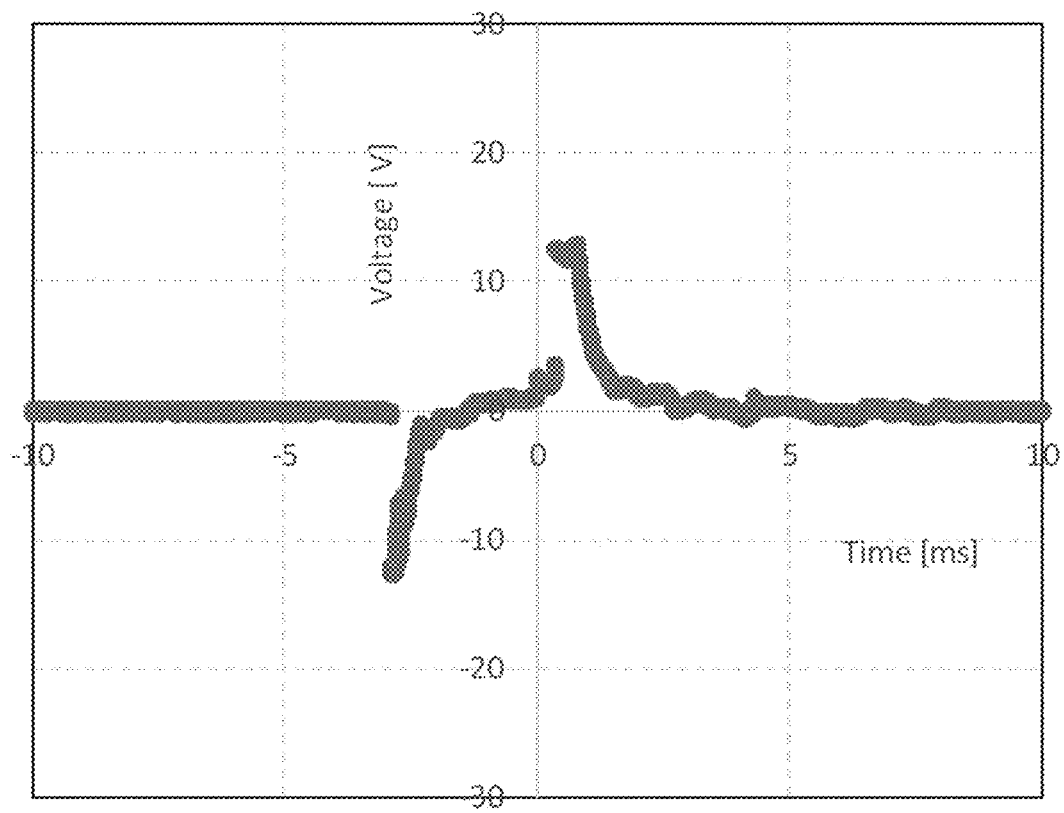
FIG. 12 is a graph showing the electromotive force of a flexoelectret structure measured in Example 1.

In the same manner as the external electrodes 5a and 5b illustrated in FIG. 4, measurement electrodes (Cu foil electrodes in this example) were disposed on the surface of the flexible member 2, and the electromotive force of the flexoelectret structure 10 was measured. The results are shown in FIG. 12.

The flexoelectric coefficient of the flexoelectret structure 10 was $6 \times 10^{-8}$ C/m. The flexoelectret structure 10 and the electret portion 1 had a radius of curvature of 1000 mm.

Although the embodiments of the present invention have been described above, typical examples have been only illustrated. Hence, those skilled in the art will easily understand that the present invention is not limited thereto, and various modes are conceivable without changing the gist of the present invention.

Although not particularly limited, the flexoelectret structure of the present disclosure can be used for a sensor such as a flexible sensor.

The flexoelectret structure of the present disclosure can also be used, for example, in an outdoor environment or a high-temperature environment. In particular, the flexoelectret structure of the present disclosure can also be used in a vehicle or the like.

Moreover, the flexoelectret structure of the present disclosure can also be used in fields such as energy capture, artificial skin, and a self-powered device.

DESCRIPTION OF REFERENCE SYMBOLS 1, 21, 31, 41, 51, 61, 71: Electret portion
2: Flexible member
2a, 72a: First flexible member
2b, 72b: Second flexible member
3, 73: Charge retaining ceramic portion
3a, 23a, 33a, 43a, 53a, 63a: First charge retaining ceramic layer
3b, 23b, 33b, 43b, 53b, 63b: Second charge retaining ceramic layer
4, 24, 34, 44, 54, 64, 74: Internal electrode
5: External electrode
5a, 45a: First external electrode
5b, 45b: Second external electrode
6: Polarization electrode
6a: First polarization electrode
6b: Second polarization electrode
10, 20, 30, 40, 50, 60, 70: Structure
22, 32, 42, 52, 62: Resin layer
22a, 32a, 42a: First resin layer
22b, 32b, 42b: Second resin layer
75: Third flexible member
100: Flexoelectret
200: Polymer flexoelectret
201: Charged polymer thin film
202: Polymer thin film

The invention claimed is:

1. A structure comprising:
    a flexible ceramic electret portion including a charge retaining ceramic portion and an internal electrode positioned at an internal location of the charge retaining ceramic portion; and
    a flexible member outside the flexible ceramic electret portion,
    wherein the charge retaining ceramic portion is composed of at least a first charge retaining ceramic layer and a second charge retaining ceramic layer, and the internal electrode is positioned between the first charge retaining ceramic layer and the second charge retaining ceramic layer.

2. The structure according to claim 1, wherein the flexible member sandwiches or surrounds the flexible ceramic electret portion.

3. The structure according to claim 1, wherein a thickness of the flexible ceramic electret portion is less than a thickness of the flexible member.

4. The structure according to claim 1, wherein the first charge retaining ceramic layer and the second charge retaining ceramic layer are made of different materials from each other.

5. The structure according to claim 1, wherein the flexible member contains a resin component.

6. A structure comprising:
    a flexible ceramic electret portion including a charge retaining ceramic portion and an internal electrode positioned at an internal location of the charge retaining ceramic portion; and
    a flexible member outside the flexible ceramic electret portion,
    wherein the flexible member is composed of at least a first resin layer and a second resin layer, and the flexible ceramic electret portion is positioned between the first resin layer and the second resin layer.

7. The structure according to claim 6, further comprising:
    a first external electrode on at least a part of an outer surface of the first resin layer, and
    a second external electrode on at least a part of an outer surface of the second resin layer.

8. The structure according to claim 7, further comprising:
    a first polarization electrode between the first resin layer and the flexible ceramic electret portion; and
    a second polarization electrode between the second resin layer and the flexible ceramic electret portion.

9. The structure according to claim 6, further comprising:
    a first polarization electrode between the first resin layer and the flexible ceramic electret portion; and
    a second polarization electrode between the second resin layer and the flexible ceramic electret portion.

10. The structure according to claim 1, wherein the structure is constructed such that a flexoelectric coefficient of the structure is larger than $1.3 \times 10^{-8}$ C/m.

11. The structure according to claim 1, wherein when the structure receives an external force and the flexible ceramic electret portion is displaced, the flexible ceramic electret portion has a radius of curvature of 1000 mm or less in a sectional view thereof without cracking or chipping.

12. The structure according to claim 6, wherein a total thickness of the structure is 0.1 mm to 10 mm.

13. The structure according to claim 1, wherein the structure has a thickness relationship: flexible member>internal electrode>charge retaining ceramic portion.

14. The structure according to claim 6, wherein the charge retaining ceramic portion has a tubular shape.

15. The structure according to claim 1, wherein a thickness of the charge retaining ceramic portion is 0.005 mm to 1 mm.

16. The structure according to claim 1, wherein the charge-retaining ceramic portion is a composite that includes a ceramic component.

17. The structure according to claim 16, wherein the composite further includes a resin.

18. The structure according to claim 6, wherein the flexible member sandwiches or surrounds the flexible ceramic electret portion.

19. The structure according to claim 6, wherein a thickness of the flexible ceramic electret portion is less than a thickness of the flexible member.

20. The structure according to claim 6, further comprising a third flexible member between the first flexible member and the second flexible member.

* * * * *